US012789227B2

(12) United States Patent
Pore et al.

(10) Patent No.: US 12,789,227 B2
(45) Date of Patent: *Nov. 10, 2026

(54) VAPOR PHASE DEPOSITION OF ORGANIC FILMS

(71) Applicant: ASM IP Holding B.V., Almere (NL)

(72) Inventors: Viljami J. Pore, Helsinki (FI); Marko Tuominen, Helsinki (FI); Hannu Huotari, Helsinki (FI)

(73) Assignee: ASM IP Holding B.V., Almere (NL)

( * ) Notice: Subject to any disclaimer, the term of this patent is extended or adjusted under 35 U.S.C. 154(b) by 25 days.

This patent is subject to a terminal disclaimer.

(21) Appl. No.: 18/906,537

(22) Filed: Oct. 4, 2024

(65) Prior Publication Data

US 2025/0025911 A1 Jan. 23, 2025

Related U.S. Application Data

(63) Continuation of application No. 17/808,384, filed on Jun. 23, 2022, now Pat. No. 12,138,654, which is a (Continued)

(51) Int. Cl.
*B05D 1/00* (2006.01)
*B05D 1/36* (2006.01)
(Continued)

(52) U.S. Cl.
CPC ................. *B05D 1/60* (2013.01); *B05D 1/36* (2013.01); *C23C 16/30* (2013.01); (Continued)

(58) Field of Classification Search
CPC ................................ C23C 16/455; B05D 1/00
See application file for complete search history.

(56) References Cited

U.S. PATENT DOCUMENTS 5,904,961 A * 5/1999 Tang ...................... B05D 1/286 427/596
10,343,186 B2 * 7/2019 Pore ......................... B05D 1/60
(Continued)

FOREIGN PATENT DOCUMENTS

JP 2004-43877 * 2/2004 ............. C23C 14/24
JP 2006-12895 * 1/2006 ............. H01L 23/52
(Continued)

OTHER PUBLICATIONS

English Translation of JP 2010-275577.*
Prasittichai, Chaiya, et al., "Area Selective Molecular Layer Deposition of Polyurea Films". Applied Materials & Interfaces, 2013, 5, 13391-13396.*
English Translation of TW 201436230.*
(Continued)

*Primary Examiner* — Bret P Chen
(74) *Attorney, Agent, or Firm* — Banner & Witcoff, Ltd.

(57) ABSTRACT

Methods for vapor depositing organic films include: (a) vaporizing a first organic reactant in a vaporizer at a temperature A to form a first reactant vapor; (b) exposing a substrate in a reaction space to the first reactant vapor, wherein the substrate is at a temperature B, the temperature B being lower than the temperature A; and (c) depositing the organic film on the substrate. The substrate may include a non-planar topography having three-dimensional structures including a plurality of trenches extending inwardly from a surface of the substrate. The depositing may include depositing a first thickness on a lower feature of the substrate within the plurality of trenches and depositing a second thickness on an upper field region of the substrate outside the plurality of trenches, wherein the first thickness is greater than the second thickness.

19 Claims, 16 Drawing Sheets

Related U.S. Application Data continuation of application No. 17/022,622, filed on Sep. 16, 2020, now Pat. No. 11,389,824, which is a continuation of application No. 16/429,750, filed on Jun. 3, 2019, now Pat. No. 10,814,349, which is a continuation of application No. 15/070,594, filed on Mar. 15, 2016, now Pat. No. 10,343,186, which is a continuation-in-part of application No. 14/879,962, filed on Oct. 9, 2015, now Pat. No. 10,695,794.

(51) Int. Cl.

| | |
|---|---|
| ***C23C 16/30*** | (2006.01) |
| ***C23C 16/455*** | (2006.01) |
| ***H10P 14/60*** | (2026.01) |
| ***H10P 14/68*** | (2026.01) |
| ***H10P 72/00*** | (2026.01) |
| *B05D 3/14* | (2006.01) |

(52) U.S. Cl.

CPC .................. *C23C 16/45523* (2013.01); *C23C 16/45525* (2013.01); *H10P 14/6334* (2026.01); *H10P 14/6339* (2026.01); *H10P 14/6532* (2026.01); *H10P 14/683* (2026.01); *H10P 72/00* (2026.01); *B05D 3/145* (2013.01); *B05D 2505/50* (2013.01)

(56) References Cited

U.S. PATENT DOCUMENTS

| | | | | |
|---|---|---|---|---|
| 10,695,794 B2 * | 6/2020 | Pore | | B05D 1/60 |
| 11,389,824 B2 * | 7/2022 | Pore | | B05D 1/36 |
| 2003/0219535 A1 * | 11/2003 | Chang | | B05D 1/60<br>427/255.6 |
| 2008/0251926 A1 * | 10/2008 | Tada | | B05D 1/62<br>438/623 |
| 2015/0174656 A1 * | 6/2015 | Kim | | H10D 64/035<br>427/205 |

FOREIGN PATENT DOCUMENTS

| | | | |
|---|---|---|---|
| JP | WO2009/099252 | * 8/2009 | H01L 21/316 |
| JP | 2010-275577 | * 12/2010 | C23C 14/24 |
| TW | 201436230 | * 9/2014 | H01L 29/78 |
| WO | WO 2011/129386 | * 10/2011 | C08G 73/00 |

OTHER PUBLICATIONS

English Translation of JP WO2009/099252.*

Matsushima, Toshinori, et al., "Molecular orientation induced by high-speed substrate transfer during vacuum vapor deposition of organic films". Organic Electronics, 13 (2012) 222-229.*

* cited by examiner

VAPOR PHASE DEPOSITION OF ORGANIC FILMS

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 CFR 1.57. This application is a continuation of U.S. patent application Ser. No. 17/808,384, filed Jun. 23, 2022, now U.S. Pat. No. 12,138,654, which is a continuation of U.S. patent application Ser. No. 17/022,622, filed Sep. 16, 2020, now U.S. Pat. No. 11,389,824, which is a continuation of U.S. patent application Ser. No. 16/429,750, filed Jun. 3, 2019, now U.S. Pat. No. 10,814,349, which is a continuation of U.S. patent application Ser. No. 15/070,594, filed Mar. 15, 2016, now U.S. Pat. No. 10,343,186, which is a continuation-in-part of U.S. patent application Ser. No. 14/879,962, filed Oct. 9, 2015, now U.S. Pat. No. 10,695,794, the disclosures of each of which are hereby incorporated by reference in their entities herein.

BACKGROUND

Field

The present invention relates to forming organic thin films by vapor deposition.

Description of the Related Art

Organic thin films have valuable optical, thermal, electrical and mechanical properties and are widely used in the electronics, medical engineering, defense, pharmaceutical, and micro- and nanotechnology industries. Polymers in the microelectronics and photonics industries include, among other examples, photon- or electron-curable/degradable polymers for lithographic patterning; and polyimides for packaging, interlayer dielectrics and flexible circuit boards. Norrman et al., *Annu. Rep. Prog. Chem.*, Sect. C, 2005, 101, 174-201.

Polyimide films in particular are valuable for their thermal stability and resistance to mechanical stress and chemicals. Polyimide thin films can be used as a starting point in semiconductor applications for amorphous carbon films or layers, which are needed for future V-NAND structures. Polyimide films can be used, for example, as antireflection layers to improve pattern definition and reduce misalignment in lithography steps, as layers in multiple patterning (e.g., SDDP, SDQP), as insulating materials for interlayer dielectric materials, or as the gate dielectric in all-organic thin film transistors.

Polymer thin films have traditionally been fabricated through spin-coating techniques. The spin-coating method forms highly functional polymer films by coating a rotating disc with a liquid material and sintering the liquid. However, tailoring of spin-applied films is limited for several reasons. For instance, formation of uniform thin films on a substrate is difficult to control, in part because of the viscosity of the starting liquid, and it can be difficult to fill the gaps of very small features (e.g., trenches or gaps between metal lines) without void generation after curing. Also, spin-coating over high topography relative to the desired thickness of the layer can result in discontinuous and non-conformal deposition. As semiconductor chip sizes continue to shrink, thinner and higher-strength films with more tunable morphology are required.

Recently, vapor phase deposition processes such as chemical vapor deposition (CVD), vapor deposition polymerization (VDP), molecular layer deposition (MLD), and sequential deposition processes such as atomic layer deposition (ALD) and cyclical CVD have been applied to the formation of polymer thin films. In CVD, a film is deposited when reactants react on a substrate surface. Gases of one or more reactants are delivered to one or more substrates in a reaction chamber. In thermal CVD, reactant gases react with one another on a hot substrate to form thin films, with the growth rate influenced by the temperature and the amount of reactant supplied. In plasma enhanced CVD, one or more reactants can be activated in a remote plasma generator or in situ. In ALD, a film is built up through self-saturating surface reactions performed in cycles. Vapor phase reactants are supplied, alternatingly and repeatedly, to the substrate or wafer to form a thin film of material on the wafer. In a typical process, one reactant adsorbs in a self-limiting process on the wafer. A different, subsequently pulsed reactant reacts with the adsorbed species of the first reactant to form no more than a single molecular layer of the desired material. Thicker films are produced through repeated growth cycles until the target thickness is achieved. Plasma enhanced variants of ALD, and hybrid ALD/CVD processes (e.g., with some overlaps of the reactants permitted) are also known.

SUMMARY

In one aspect, a method is provided for depositing an organic film by vapor deposition. The method comprises vaporizing a first organic reactant in a vaporizer at a temperature A to form a first reactant vapor. A substrate in a reaction space is exposed to the first reactant vapor at a temperature B, which is lower than the temperature A at which the first organic reactant was vaporized. An organic film is deposited on the substrate.

In some embodiments, the organic film comprises a polymer. In some embodiments the polymer is a polyimide. In some embodiments, the organic film comprises polyamic acid. In some embodiments, the polyamic acid is further converted to polyimide. In some embodiments, the first organic reactant is a solid at room temperature and atmospheric pressure. In some embodiments, the first organic reactant is a dianhydride, and more particularly, in some embodiments, PMDA.

The ratio of temperature A to temperature B in Kelvin is greater than 1. In some embodiments, the ratio of temperature A to temperature B in Kelvin can be less than 1.8, between about 1 and 1.25, between about 1.01 and 1.10, and/or between any of the other foregoing values.

In some embodiments, the temperature A can be greater than 120° C., less than 200° C., between about 120° C. and 250° C., between about 140° C. and 190° C., and/or between any of the other foregoing values.

In some embodiments, the temperature B is between about 5° C. and about 50° C. lower than the temperature A, between about 10° C. and about 30° C. lower than the temperature A, and/or between any of the other foregoing values lower than the temperature A.

In some embodiments, the temperature B can be greater than 20° C., less than 250° C., between about 20° C. and 250° C., between about 100° C. and 200° C., between about of 120° C. to 180° C., and/or between any of the other foregoing values.

In some embodiments, the method further includes removing excess of the first reactant vapor from contact with the substrate. The substrate is then exposed to a second reactant, such that the first reactant vapor and the second reactant vapor do not substantially mix, and excess of the second reactant is removed from contact with the substrate. In some embodiments, the steps of exposing the substrate to the first reactant vapor and exposing the substrate to the second reactant are repeated in a plurality of cycles, such that the first reactant vapor and the second reactant vapor do not substantially mix. In some embodiments, the second reactant is a diamine, and more particularly, in some embodiments, 1,6-diaminohexane (DAH). In some embodiments, each of removing the excess of the first reactant vapor and removing the excess of the second reactant vapor occurs over a time period greater than 1 second, less than 10 seconds, between about 1 second and about 10 seconds, and/or between any of the other foregoing values.

In some embodiments, when the first reactant vapor is exposed to the substrate, it is transported from the vaporizer to the reaction space through a gas line. In some embodiments, the gas line is at a temperature C, which is higher than the temperature A at which the first organic reactant was vaporized.

In some embodiments, the substrate comprises a non-planar topography, and the deposited organic film comprises forming a first thickness on a lower feature of the substrate, and depositing a second thickness on an upper field region of the substrate, where the first thickness is greater than the second thickness.

In another aspect, a method is provided for controlling planarity of a deposited organic film. The method comprises vaporizing a first organic reactant in a vaporizer at a temperature A to form a first reactant vapor; exposing a substrate in a reaction space to the first reactant vapor at a temperatures B, which is lower than the temperature A; and removing excess of the first reactant vapor from contact with the substrate over a period of time, where decreasing the period of time increases the planarity of the deposited organic film. In some embodiments the deposited organic film has thickness non-uniformity (1sigma) of below about 20%, below about 10%, below about 5%, below about 2%, below about 1% and below about 0.5%. In some embodiments the substrate is a semiconductor wafer, such as 200 mm or 300 silicon mm wafer, or a glass substrate.

In some embodiments, the method further comprises exposing the substrate to a second reactant such that the first reactant vapor and the second reactant do not substantially mix; removing excess of the second reactant from contact with the substrate; and repeating exposure of the substrate to the first reactant vapor and exposure of the substrate to the second reactant in a plurality of cycles, such that the first reactant vapor and the second reactant do not substantially mix.

In another aspect, an apparatus for organic film deposition comprises a vessel configured for vaporizing a first organic reactant to form a first reactant vapor, a reaction space configured to accommodate a substrate and in selective fluid communication with the vessel; and a control system. In a preferred embodiment, the control system is configured to maintain the reactant in the vessel at or above a temperature A, maintain the substrate at a temperature B that is lower than the temperature A, transport the first reactant vapor from the vessel to the substrate, and deposit an organic film on the substrate.

In some embodiments, the apparatus is configured to deposit a polymer. In some embodiments, the polymer comprises a polyimide. In some embodiments, the apparatus is configured to deposit polyamic acid. In some embodiments, the polyamic acid can be converted to polyimide.

In some embodiments, the apparatus further comprises a gas line fluidly connecting the vessel to the reaction space, wherein the control system is further configured to maintain the gas line at a temperature C that is higher than the temperature A.

In some embodiments, the control system is further configured to transport a second reactant vapor to the substrate alternately with the first reactant vapor in a sequential deposition process.

In some embodiments, the apparatus further comprises an outlet line and an inert gas source connected to the reaction space, and the control system is further configured to remove excess reactant vapors and byproduct between supply of the first reactant vapor and the second reactant vapor.

In another aspect, a method for reducing the aspect ratio of three-dimensional structures on a substrate is provided. The method includes vaporizing a first reactant to form a first reactant vapor. The substrate is exposed in a reaction space to the first reactant vapor, the substrate that includes a topography with a three-dimensional structure. An organic film is deposited over the substrate preferentially over lower features of the topography compared to higher features of the topography such that the organic film reduces an aspect ratio of the three-dimensional structure on the substrate as it deposits. Depositing includes exposing the substrate to the first reactant vapor.

In another aspect, a method is provided for forming an organic film. The method includes vaporizing a first reactant in a vaporizer to form a first reactant vapor. A substrate in a reaction space is exposed to the first reactant vapor and a second reactant vapor. A polyamic acid film from the first reactant vapor and the second reactant vapor on the substrate.

DETAILED DESCRIPTION

Figure 1A:
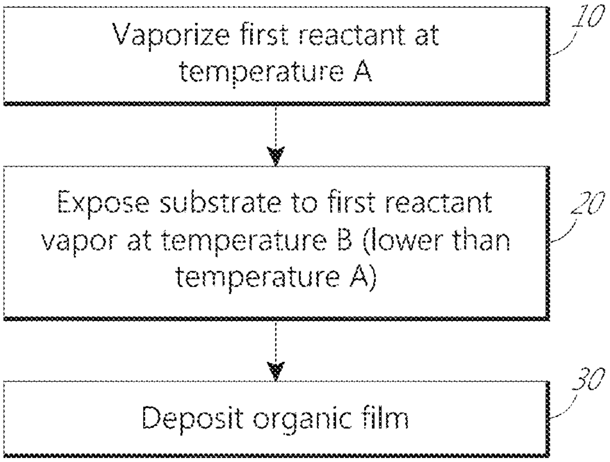
FIGS. 1A-1B are flow diagrams illustrating methods for vapor deposition of an organic film.

Vapor phase deposition techniques can be applied to organic films and polymers such as polyimide films, polyamide films, polyurea films, polyurethane films, polythiophene films, and more. CVD of polymer films can produce greater thickness control, mechanical flexibility, conformal coverage, and biocompatibility as compared to the application of liquid precursor. Sequential deposition processing of polymers can produce high growth rates in small research scale reactors. Similar to CVD, sequential deposition processes can produce greater thickness control, mechanical flexibility, and conformality. The terms "sequential deposition" and "cyclical deposition" are employed herein to apply to processes in which the substrate is alternately or sequentially exposed to different precursors, regardless of whether the reaction mechanisms resemble ALD, CVD, MLD or hybrids thereof.

However, vapor phase deposition of organic thin films can be challenging for a variety of reasons. For example, reactants for fabricating organic films tend to have low vapor pressure and volatility, and thus require a high source temperature to vaporize. It can be difficult to ensure sufficient vapor pressure is developed to allow for the vapor deposition to properly proceed, while at the same time avoiding thermal decomposition. Furthermore, the substrate temperature is typically higher than the vaporizer to drive the deposition reactions, but high vaporization temperatures to increase the vapor pressure of the precursor not only risks premature thermal decomposition, but also can lead to excessively high deposition rates and consequent non-conformal deposition.

For example, polyimide film can be deposited by reacting a dianhydride and a diamine, and the dianhydride typically used for this process is pyromellitic dianhydride (PMDA). At room temperature and atmospheric pressure, PMDA is a solid with quite low vapor pressure, and consequently, it requires heating to vaporize. Failure to control evaporation temperatures in CVD/VDP of polyimide films can lead to crack formation, and, despite potential on the small research scale, production-scale sequential deposition of polyimide faces numerous difficulties for manufacturability (e.g., particles, poor repeatability, clogging of gas lines, poor uniformity, low growth rate).

Due to strict requirements of reactant volatility and growth temperature, obtaining high quality organic films using conventional vapor phase deposition techniques is challenging. Accordingly, a need exists for an improved approach for vapor deposition of organic thin films.

In embodiments described herein, the growth temperature at the substrate can be lower than the reactant source temperature. This temperature profile allows high enough vapor pressure for the reactant (e.g., precursors for organic film deposition, such as PMDA) to vaporize, low enough growth temperature to avoid the problems of overheating, and enables a high growth rate process. Deposition processes taught herein can achieve high growth rate and throughput, and produces high quality organic thin films.

FIG. 1A is a simplified flow diagram of a method for vapor deposition of an organic film. In the first illustrated block 10, a first organic reactant is vaporized at a temperature A to form a first reactant vapor. The reactant being vaporized may be liquid or solid under standard temperature and pressure conditions (room temperature and atmospheric pressure). In some embodiments, the reactant being vaporized comprises an organic precursor, such as a dianhydride, for example pyromellitic dianhydride (PMDA). In block 20, the substrate is exposed to the first reactant vapor at a temperature B that is lower than the temperature A, and in block 30, an organic film deposited. The method can include additional steps, and may be repeated, but need not be performed in the illustrated sequence nor the same sequence in each repetition if repeated, and can be readily extended to more complex vapor deposition techniques.

In some embodiments, the organic film comprises a polymer. In some embodiments, the polymer deposited is a polyimide. In some embodiments, the polymer deposited is a polyamide. In some embodiments, the polymer deposited is a polyurea. Other examples of deposited polymers include dimers, trimers, polyurethanes, polythioureas, polyesters, polyimines, other polymeric forms or mixtures of the above materials.

In some embodiments, the organic film comprises a precursor material to a polymer film that can be converted or polymerized by a treatment process. For example, the as-deposited organic film may comprise a polyamic acid. In some embodiments, the polyamic acid is converted to a polyimide. In particular, polyamic acid is a common polyimide precursor that can be cyclized, or imidized, to form polyimide. It has been found in experiments that, for vapor deposition using a dianhydride and diamine, the composition of the as-deposited film depends upon the substrate temperature. For example, in experiments, below about 130° C. the as-deposited film was found to be mostly polyamic acid. Between about 130° C. and 160° C., the film was a mixture of polyamic acid and polyimide. Above about 160° C. the film was mostly polyimide (polymer). Polyamic acid can be converted to polyimide in a variety of techniques, including annealing, plasma (e.g., using an inert or rare gas), chemical treatment (e.g., using an anhydride), UV treatment, and other post-deposition treatments.

The term "about" is employed herein to mean within standard measurement accuracy.

Figure 1B:
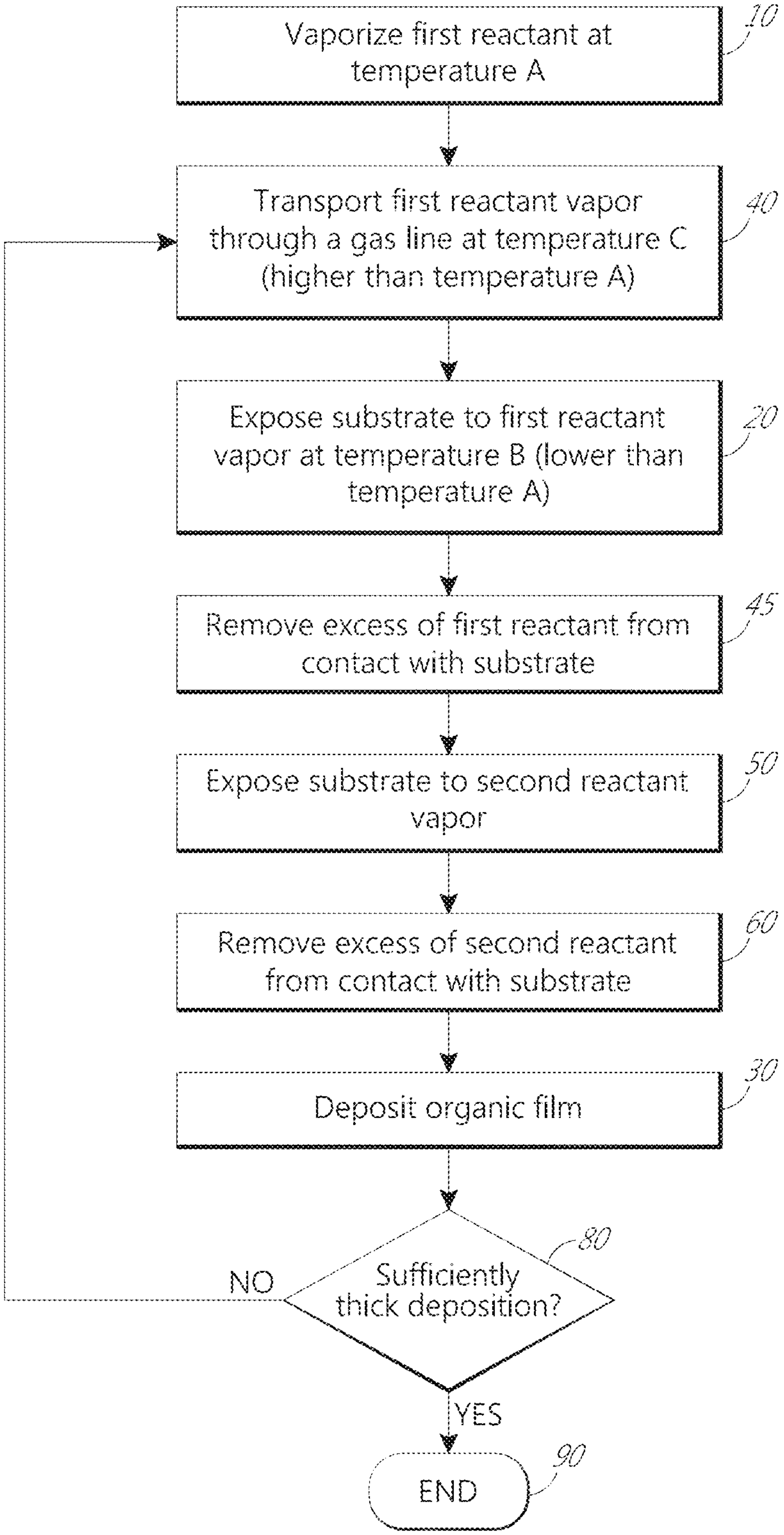

The techniques taught herein can be applied to vapor deposition techniques, including CVD, VPD, ALD, and MLD in a wide variety of reactor configurations. FIG. 1B is a simplified flow diagram of a sequential deposition process, and FIGS. 2A-2D illustrate schematic representations of exemplary reactor configurations.

The flow chart of FIG. 1B illustrates a sequential deposition method for vapor deposition of an organic film. In block 10, a first organic reactant is vaporized at temperature A to form a first reactant vapor. In block 40, the first reactant vapor is transported to the substrate through a gas line at temperature C, which is higher than temperature A. In an embodiment, the first reactant, or species thereof, chemically adsorbs on the substrate in a self-saturating or self-limiting fashion. The gas line can be any conduit that transports the first reactant vapor from the source to the substrate. In block 20, the substrate is exposed to the first reactant vapor at a temperature B that is lower than the temperature A. In block 45, excess of the first reactant vapor (and any volatile reaction by-product) is removed from contact with the substrate. Such removal can be accomplished by, e.g., purging, pump down, moving the substrate away from a chamber or zone in which it is exposed to the first reactant, or combinations thereof. In block 50, the substrate is exposed to a second reactant vapor. In an embodiment, the second reactant may react with the adsorbed species of the first reactant on the substrate. In block 60, excess of the second reactant vapor (and any volatile reaction by-product) is removed from contact with the substrate, such that the first reactant vapor and the second reactant vapor do not mix. In some embodiments the vapor deposition process of the organic film does not employ plasma and/or radicals, and can be considered a thermal vapor deposition process.

Various reactants can be used for these processes. For example, in some embodiments, the first reactant is an organic reactant such as an anhydride, for example a dianhydride, e.g., pyromellitic dianhydride (PMDA), or any other monomer with two reactive groups. In some embodiments, the first reactant can be an anhydride, such as furan-2,5-dione (maleic acid anhydride). In some embodiments, the second reactant is also an organic reactant capable of reacting with adsorbed species of the first reactant under the deposition conditions. For example, the second reactant can be a diamine, e.g., 1,6-diamnohexane (DAH), or any other monomer with two reactive groups which will react with the first reactant. In some embodiments, different reactants can be used to tune the film properties. For example, a polyimide film and/or polyimide precursor material (e.g., polyamic acid) film could be deposited using 4,4'-oxydianiline or 1,4-diaminobenzene instead of 1,6-diaminohexane to get a more rigid structure with more aromaticity and increased dry etch resistance. In some embodiments the reactants do not contain metal atoms. In some embodiments the reactants do not contain semimetal atoms. In some embodiments one of the reactants comprises metal or semimetal atoms. In some embodiments the reactants contain carbon and hydrogen and at least one or more of the following elements: N, O, S, P or a halide, such as Cl or F. Deposition conditions can differ depending upon the selected reactants and can be optimized upon selection. For sequential deposition of polyimide using the PMDA and DAH in a single wafer deposition tool, substrate temperatures can be selected from the range of about 100° C. to about 250° C., and pressures can be selected from the range of about 1 mTorr to about 760 Torr, more particularly between about 100 mTorr to about 100 Torr. In some embodiments, the reactant being vaporized comprises an organic precursor selected from the group of 1,4-diisocyanatobutane or 1,4-diisocyanatobenzene. In some embodiments the reactant being vaporized comprises an organic precursor selected from the group of terephthaloyl dichloride, alkyldioyl dichlorides, such as hexanedioyl dichloride, octanedioyl dichloride, nonanedioyl dichloride, decanedioyl dichloride, or terephthaloyl dichloride. In some embodiments, the reactant being vaporized comprises an organic precursor selected from the group of 1,4-diisothiocyanatobenzene or terephthalaldehyde. In some embodiments, the reactant being vaporized can be also diamine, such as 1,4-diaminobenzene, decane-1,10-diamine, 4-nitrobenzene-1,3-diamine or 4,4'-oxydianiline. In some embodiments, the reactant being vaporized can be terephthalic acid bis(2-hydroxyethyl) ester. In some embodiments the reactant being vaporized can be carboxylic acid, for example alkyl-, alkenyl-, alkadienyl-dicarboxylic or tricarboxylic acids, such as ethanedioic acid, propanedioic acid, butanedioic acid, pentanedioic acid or propane-1,2,3-tricarboxylic acid. In some embodiments, the reactant being vaporized can be aromatic carboxylic or dicarboxylic acid, such as benzoic acid, benzene-1,2-dicarboxylic acid, benzene-1,4-dicarboxylic acid or benzene-1,3-dicarboxylic acid. In some embodiments, the reactant being vaporized can be selected from the group of diols, triols, aminophenols such as 4-aminophenol, benzene-1,4-diol or benzene-1,3,5-triol. In some embodiments, the reactant being vaporized can be 8-quinolinol. In some embodiments, the reactant being vaporized can comprise alkenylchlorosilanes, like alkenyltrichlorosilanes, such as 7-octenyltrichlorosilane In block 30, an organic film is deposited. The skilled artisan will appreciate that block 30 may represent the result of blocks 10, 40, 20, 45, 50 and 60, rather than a separate action. The blocks 10-60 together define a cycle 70, which can be repeated until a film of sufficient thickness is left on the substrate (block 80) and the deposition is ended (block 90). The cycle 70 can include additional steps, need not be in the same sequence nor identically performed in each repetition, and can be readily extended to more complex vapor deposition techniques. For example, cycle 70 can include additional reactant supply blocks, such as the supply and removal of additional reactants in each cycle or in selected cycles. Though not shown, the process may additionally comprise treating the deposited film to form a polymer (e.g., UV treatment, annealing, etc.).

In some embodiments the organic film does not contain metal atoms. In some embodiments the organic film does not contain semimetal atoms. In some embodiments the organic film contains metal or semimetal atoms. In some embodiments the organic film contains carbon and hydrogen and at least one or more of the following elements: N, O, S, or P.

Figure 2A:
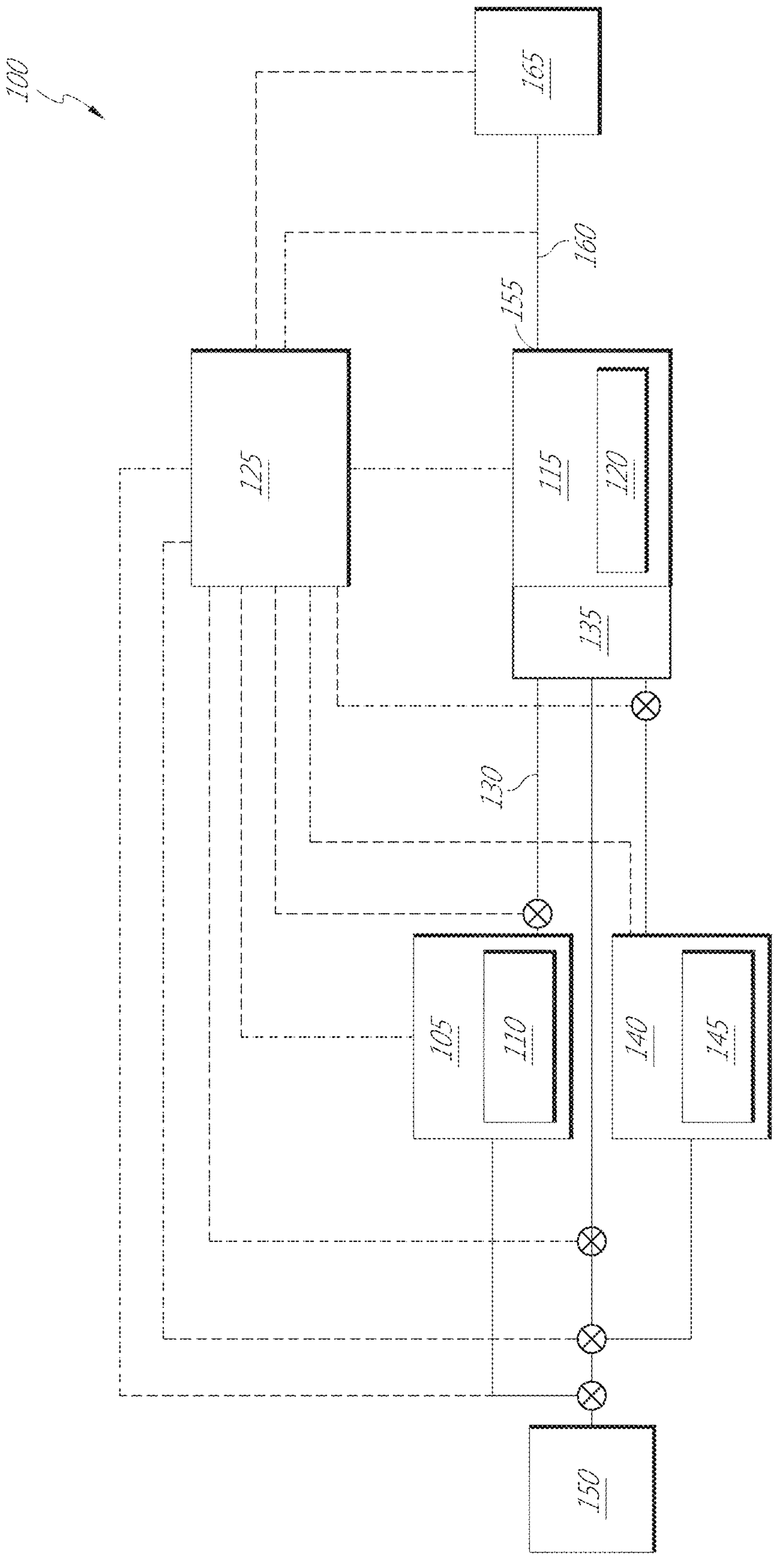
FIGS. 2A-2D are schematic representations of examples of vapor deposition apparatuses that can be employed for the deposition processes described herein.

FIG. 2A is a simplified schematic representation of apparatus 100 for vapor deposition of an organic film. The apparatus includes a first reactant vessel 105 configured for vaporizing a first organic reactant 110 to a first reactant vapor. A reaction chamber defines a reaction space 115 configured to accommodate at least one substrate 120. A control system 125 is configured to maintain the first reactant 110 in the first reactant vessel 105 at a temperature A, and is configured to maintain the substrate 120 in the reaction space 115 at a temperature B, where the temperature B is lower than the temperature A.

A gas line 130 fluidly connects the first reactant vessel 105 to the reaction space 115, and is configured to selectively transport the first reactant vapor from the first reactant vessel 105 to an inlet manifold 135 to the reaction space 115. In an embodiment, the control system 125 or a separate temperature control is configured to maintain the gas line 130 at a temperature C, where the temperature C is higher than the temperature A.

The apparatus 100 includes a second reactant vessel 140 holding a second reactant 145. In some embodiments, the second reactant 145 is naturally in a gaseous state; in other embodiments, the second reactant vessel 140 is also configured to vaporize the second reactant 145 from a natural liquid or solid state. The second reactant vessel is in selective fluid communication with the inlet manifold 135. The inlet manifold can include a shared distribution plenum across the chamber width, or can maintain separate paths to the reaction space 120 for separate reactants. For sequential deposition embodiments, it can be desirable to keep the reactant inlet path separate until introduction to the reaction space 115 in order to avoid reactions along the surface of common flow paths for multiple reactants, which can lead to particle generation. The apparatus can in some embodiments include additional vessels for supply of additional reactants.

One or more inert gas source(s) 150 is (are) in selective fluid communication with the first reactant vessel 105 and with the reaction space 115. The inert gas source 150 can also be in selective fluid communication with the second reactant vessel 140, as shown, and any other desired reactant vessels to serve as a carrier gas. The control system 125 communicates with valves of the gas distribution system in accordance with deposition methods described herein. For sequential deposition processing, the valves are operated in a manner that alternately and repeatedly exposes the substrate to the reactants, whereas for simultaneous supply of the reactants in a conventional CVD process, the valves can be operated to simultaneously expose the substrate to mutually reactive reactants.

An exhaust outlet 155 from the reaction space 115 communicates through an exhaust line 160 with a vacuum pump 165. The control system 125 is configured to operate the vacuum pump 165 to maintain a desired operational pressure and exhaust excess reactant vapor and byproduct through the exhaust outlet 155.

Figure 2B:
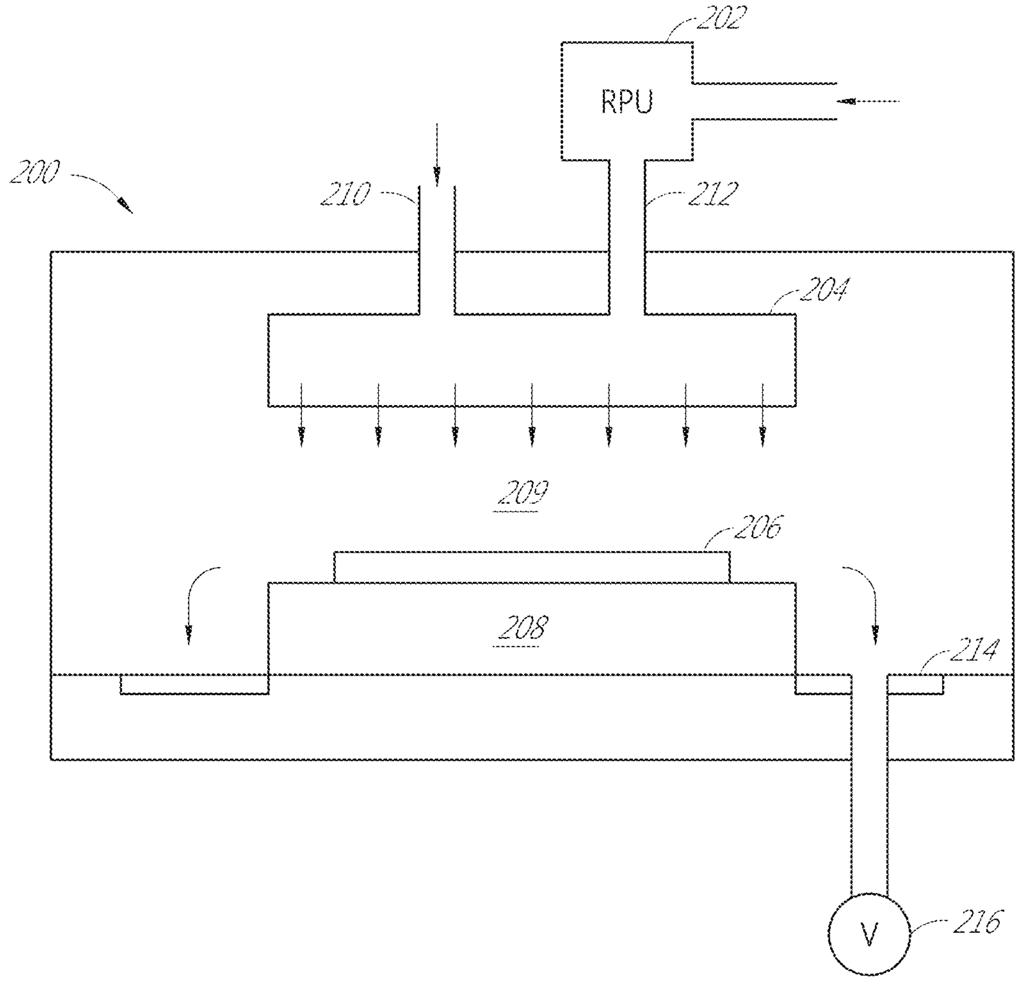

FIG. 2B schematically illustrates an example of a showerhead reaction chamber 200 that can be employed for vapor deposition of an organic film as described herein. The reactor includes a showerhead 204 configured to receive and distribute reactant vapors across a substrate 206 on a substrate support 208. While illustrated as a single substrate chamber, the skilled artisan will appreciate that shower reactors can also accommodate multiple substrates. A reaction space 209 is defined between the showerhead 204 and the substrate 206. A first inlet 210 communicates with a source of a first reactant, and a second inlet 212 communicates with a source of a second reactant. Additional inlets (not shown) can be provided for separate sources of inert gases and/or additional reactants, and the showerhead 204 can also be provided with a separate exhaust (not shown) to speed removal of reactants between phases for sequential deposition (e.g., ALD) processes. While the first inlet 210 and the second inlet 212 are both shown communicating with a single plenum of the showerhead 204, it will be understood that in other arrangements the inlets can independently feed reactants to the reaction space and need not share a showerhead plenum. An exhaust outlet 214, shown in the form of an exhaust ring surrounding the base of the substrate support 208, communicates with a vacuum pump 216.

Figure 2C:
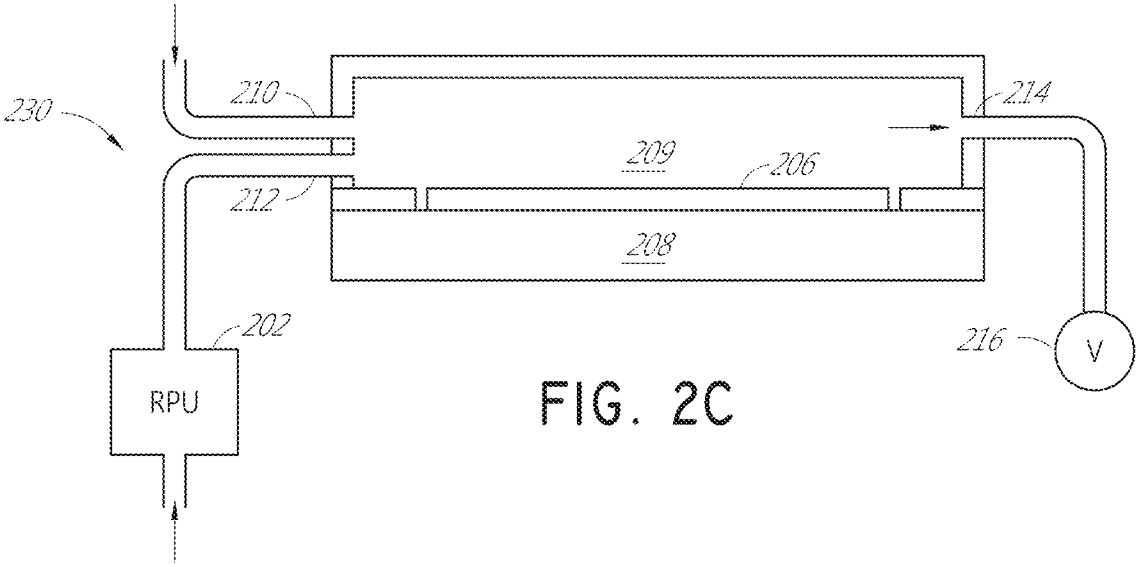

FIG. 2C illustrates a different configuration of a reaction chamber 230 that can be employed for vapor deposition of an organic film as described herein, where features similar in function to those of FIG. 2B are referenced by like reference numbers. Typically known as a horizontal flow reactor, the reaction chamber 230 is configured with a first reactant inlet 210 and a second reactant inlet 212, and an exhaust outlet 214. While illustrated as a single substrate chamber, the skilled artisan will appreciate that horizontal flow reactors can also accommodate multiple substrates. Additional inlets (not shown) can be provided for separate sources of inert gases and/or additional reactants. Separate inlets 210, 212 are shown to minimize deposition reactions upstream of the reaction space 209, as is generally preferred for sequential deposition reactors, but it will be understood that in other arrangements the different reactants can be provided through a common inlet manifold, particularly for CVD processing. While the second inlet 212 is illustrated as feeding from a remote plasma unit 202, the skilled artisan will appreciate that the RPU can be omitted or left unpowered for thermal deposition processes. The skilled artisan will appreciate that in other types of horizontal flow reactors, the different reactants can also be provided from different sides of the chamber, with separate exhausts operated alternately on the different sides, such that a first reactant can flow in one direction and a second reactant can flow in another direction in separate pulses.

Figure 2D:
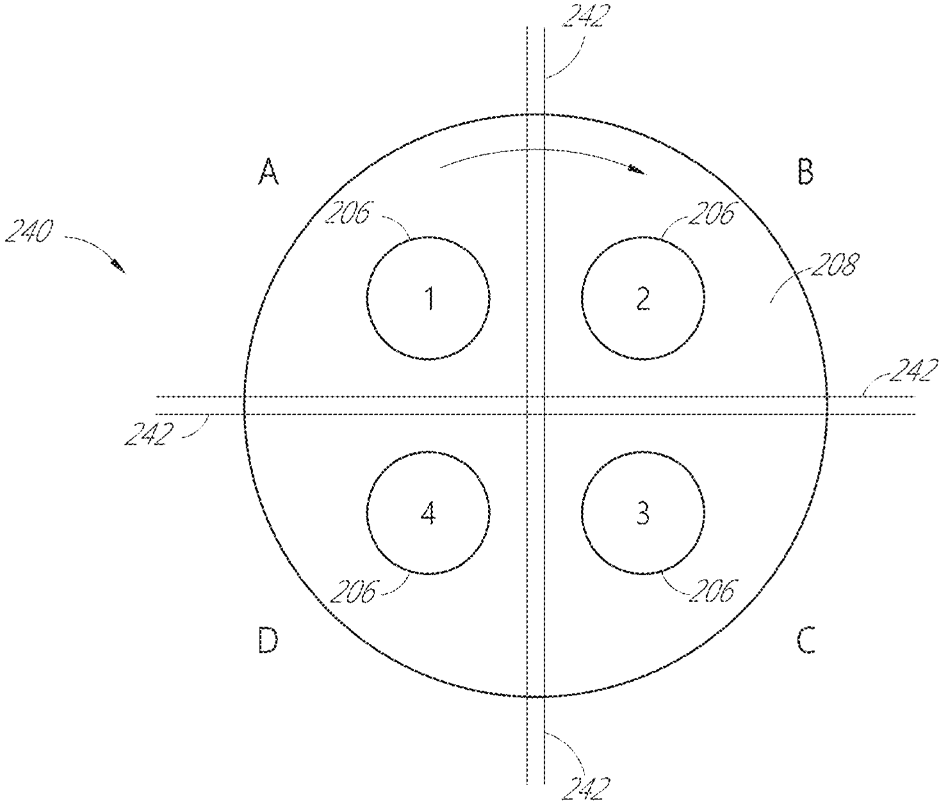

FIG. 2D illustrates another example of a reaction chamber 240 that can be employed for vapor deposition of an organic film. The illustrated chamber is configured for space-divided sequential deposition reactions, rather than time-divided reactions. The space-divided reactions employ different zones, here zones A, B, C and D, through which substrates move. Alternatively, the gas injection system can move in relation to the substrates and substrates might be stationary or rotating. The zones are separated by barriers 242, which may be physical walls, inert gas curtains, exhausts, or combinations thereof that minimize vapor interactions among the zones A-D. The substrate support(s) 208 can take the form of a rotating platform, as shown, or a conveyor belt (not shown) for linearly arrayed zones. In one example, zone A could be plumbed and operated to be supplied consistently with a first reactant, such as a precursor that adsorbs on the substrate, zones B and D could be plumbed and operated to be supplied with inert or purge gas, and zone C could be plumbed and operated supplied with a second reactant that reacts with the adsorbed species of the first reactant. Substrates 206 (four shown) move through the zones to sequentially be exposed to the first reactant (zone A), inert gas (zone B), second reactant (zone C), and inert gas (zone D) before the cycle is repeated. In the case of space-divided plasma sequential deposition, the residence time of the reactants can depend on both the speed of the reactants through the zone as well as the rate of movement of the substrate support 208. In some cases the substrate is stationary or rotating and the gas supply system, such as gas injector(s), is rotated over the substrates. Rotation speed of the injector(s) or substrates can also affect the gas residence time. In variations on space-divided sequential deposition, a combination of space-divided and time-divided sequential deposition could supply different reactants at different times to the same zone, while substrates move through the zones. Each zone may supply separate reactants, and additional zones may be added by providing larger platforms divided by greater numbers of zones, or by providing longer conveyors through greater numbers of zones.

While not shown, the skilled artisan will readily appreciate that the principles and advantages taught herein are applicable to other types of vapor deposition reactors, including batch reactors, such as vertical furnaces, which are known in the art for CVD and sequential deposition (e.g., ALD, cyclical CVD and hybrids) processing.

Figure 3A:
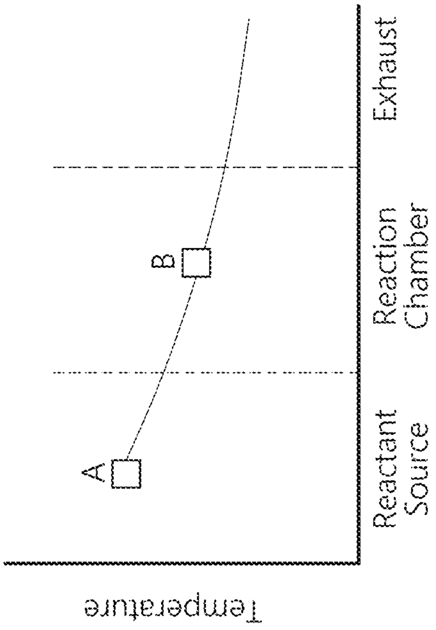
FIGS. 3A-3B are graphs illustrating temperature at different stages of methods for vapor depositing an organic film.
Figure 3B:
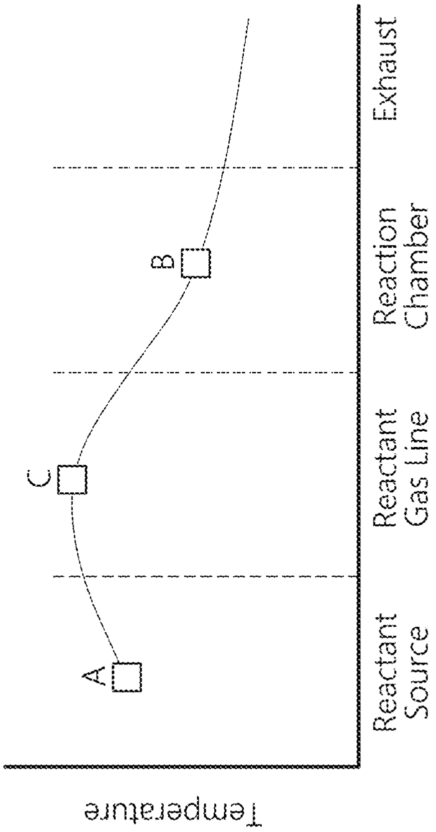

The graphs of FIGS. 3A-3B illustrate the temperature at different stages of methods for vapor depositing an organic film. FIG. 3A illustrates a temperature profile along the reactant path in accordance with embodiments. The source of the reactant is vaporized at a temperature A. The reaction chamber, or at least the substrate, is kept at a temperature B, which is lower than the temperature A. FIG. 3B illustrates the temperature profile of some embodiments where the reactant vapor is transported from the vaporization vessel to the reaction chamber in a gas line at a temperature C that is higher than the temperature A. The higher temperature gas line reduces the risk of condensation and consequent contamination and/or gas line clogging.

The illustrated temperature profile can be applied to a wide variety of vapor deposition processes that involve low vapor pressure reactants and/or growth temperature restrictions. The particular temperatures in each reaction will depend on multiple factors, including the reactants, desired film properties, deposition mechanism and reactor configuration. The embodiments are particularly useful for vaporizing organic precursors for vapor phase organic film deposition.

Precursor condensation or multilayer adsorption can cause problems in repeatability and process stability. Condensation or multilayer adsorption can occur when the source temperature is higher than the deposition temperature. In some embodiments, the pressure in the source vessel and source lines is higher than the pressure in the reaction chamber or zone where deposition takes place. This negative pressure difference can decrease the probability of precursor condensation and multilayer adsorption. This negative pressure difference can be applied to one or more of the reactants to a vapor deposition process, including both reactants subject to the temperature profile illustrated in FIG. 3A and reactants not subject to the temperature profile illustrated in FIG. 3A. In experiments, the PMDA source line was at 45-50 Torr while the reaction chamber was at about 2-10 Torr. In some embodiments, the pressure difference between the source line and the reaction chamber or zone where deposition takes place can be greater than 1 mTorr, less than 760 Torr, between about 1 mTorr and 760 Torr, between about 5 mTorr and 300 Torr, between about 10 Torr and 200 Torr, and/or between any of the other foregoing values. In some embodiments the ratio of the pressure of the source line to the pressure of the reaction chamber or zone where deposition takes place, in Torr, can be greater than 1.01, less than 1000, between about 2 and 100, between about 3 and 50, between about 5 and 25, and or between any of the other foregoing values.

In some embodiments of the invention, the temperature A can be greater than 120° C., less than 250° C., between about 120° C. and 200° C., between about 140° C. and 190° C., and/or between any of the other foregoing values. In some embodiments, the temperature B is between about 5° C. and about 50° C. lower than the temperature A, between about 10° C. and about 30° C. lower than the temperature A, and/or between any of the other foregoing values lower than the temperature A. In some embodiments, the temperature C is between about 0.1° C. and about 300° C. higher than the temperature A, between about 1° C. and about 100° C. higher than the temperature A, between about 2° C. and about 75° C. higher than the temperature A, between about 2° C. and about 50° C. higher than the temperature A, and/or between any of the other foregoing value higher than the temperature A. In some embodiments, the ratio of temperature C to temperature A in Kelvin is between about 1.001 and about 2.0, between about 1.001 and about 1.5, between about 1.001 and about 1.25 and/or between about 1.001 to about 1.10. In some embodiments the temperature C can be lower than temperature A, but higher than temperature B. In some embodiments the temperature C can be between about 0.1° C. to about 200° C., between about 0.1° C. to about 50° C., between about 0.1° C. to about 30° C. lower than temperature A, but higher than temperature B. However in some embodiments the temperature C can be about the same as temperature A, but higher than temperature B. In some embodiments the temperatures A, B and C can be about equal In addition to the low vapor pressure of reactants, the fine particulate form of solid reactants can pose problems during vapor deposition. The particles can be easily blown or carried to the substrate, for example, if the pressure differences during pulsing for deposition are too great. While filters can be used to reduce the particulates blown or carried to the substrate, filters can become clogged, and can decrease the gas line conductance so much that the dose becomes too low. Accordingly it is preferable to limit the pressure differences during deposition to less than about 80 Torr, and more particularly to less than about 50 Torr, and do without filters.

It has been found that depositing organic film using the embodiments described herein facilitates tailoring film morphology. In some embodiments, employing alternate pulsing to reactants and equipment and lower deposition temperature compared to the precursor source vessel, or vaporizer, a desirably non-conformal film that reduces the aspect ratio of three-dimensional structures can be deposited on a non-planar substrate. In some embodiments, the non-planar substrate comprises trenches or vias or other three-dimensional structures. The film can be deposited in a manner that achieves thicker film on a lower feature of the substrate than on an upper field region of the substrate. Such bottom-up deposition is surprising given that conventional vapor deposition typically either grows faster on upper field areas (such as conventional CVD), leading to pinching at the top of trenches and "keyhole" formation, or is conformal (such as conventional sequential deposition processes).

Figure 4C:
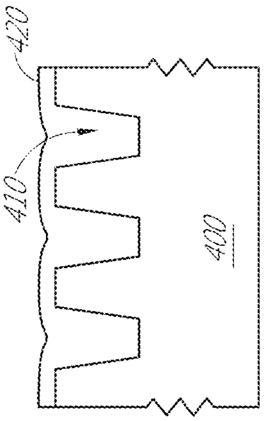
FIGS. 4A-4E are representations of bottom-up filling of trenches in accordance with a method for vapor depositing an organic film.
Figure 4B:
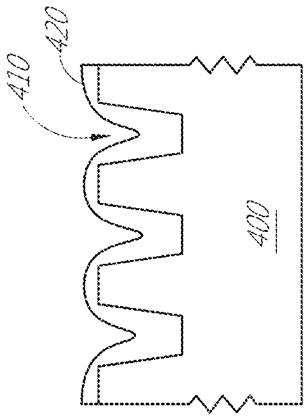
Figure 4A:
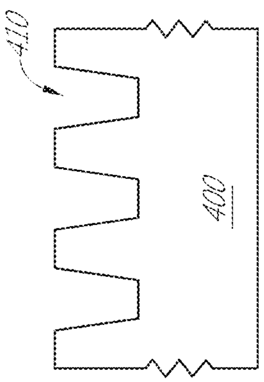

FIGS. 4A-4C are schematic representations of a vapor deposition process that reduces the aspect ratio of three-dimensional structures of a substrate in accordance with some embodiments. FIG. 4A illustrates a schematic representation of a cross section of a substrate 400 with a pattern of three dimensional (3D) features in the form of trenches 410. In other embodiments, the substrate can have different surface topography. The 3D features can be quite small with high aspect ratios, which ordinarily makes it difficult to reach the bottom with deposition and fill gaps in the features, or trenches, without forming voids. In the illustrated embodiment, the 3D features can have lateral dimensions from 5 nm to 10 μm, more particularly about 5 nm to about 500 nm, or about 10 nm to about 200 nm. At the same time, the ratio of height to width, or aspect ratio, of the 3D features, or trenches 410 for the illustrated embodiment, can range between about 0.25 to 1000, about 0.5 to about 100, more particularly about 1.0 to 75, and even more particularly from about 2.0 to about 50. FIG. 4B illustrates a cross section of the substrate 400 where the polymer 420 being deposited exhibits reduction of the aspect ratio of the trenches 410 as the deposition favors the bottom of the 3D features in a bottom-up filling process, in contrast to most vapor deposition techniques. FIG. 4C illustrates a cross section of the substrate 400 where the deposited organic film 420 has filled the trenches 410 evenly without any seams visible in the micrograph and without voids. In some embodiments, the deposited organic film decreases the aspect ratio in the three-dimensional structures by a factor more than about 1.5, more than about 5, more than about and more than about 25 or in some embodiments by a factor more than about 100. In some embodiments, the deposited organic film decreases the aspect ratio of the substrate so that there is no substantial aspect ratio left anymore after the deposition of the organic film. In some embodiments, the deposited organic fills the three-dimensional structures, such as vias or trenches, at least about 50%, at least about 75%, at least about 90%, at least about 95% of the volume of the three-dimensional structure without having any substantial seam or voids in the filled volume. In some embodiments the deposited organic fills the three-dimensional structures, such as vias or trenches, fully and/or there exists organic and substantially planar film above top level of the three-dimensional structures in the substrate. The deposited organic film can comprise polyamic acid, polyimide, polyurea, polyurethane, polythophene, and mixtures thereof.

Figure 4D:
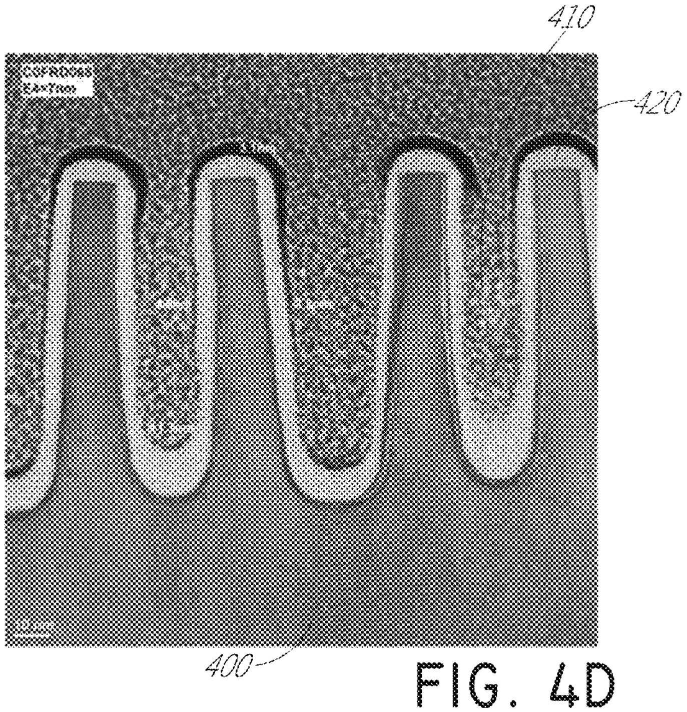
Figure 4E:
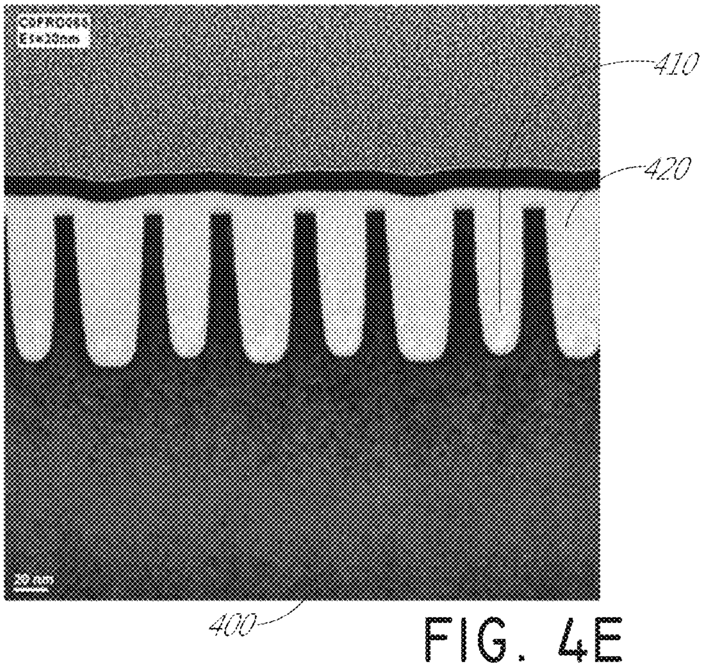

FIGS. 4D-4E are electron micrographs showing the results of a negative temperature difference experiment, where PMDA and DAH were alternately and sequentially provided to the substrate in sequential deposition process to deposit a polyimide film. The first reactant PMDA was vaporized at a temperature of 150° C., the PMDA gas line was maintained at 155° C., and the substrate was maintained at 127° C. Line flows of 450 sccm, pump line pressure of 2 torr, and source line pressure of 40-100 torr were used. Pulse/purge lengths of 11/8.1 seconds and 4.7/9 seconds were used for PMDA and DAH, respectively. FIG. 4D illustrates a cross section of a substrate 400 where a polymer 420 has been deposited with bottom-up filling of the trenches 410 after 20 cycles. FIG. 4E illustrates a cross section of a substrate 400 where a polymer 420 has been deposited with bottom-up filling of the trenches 410 after 60 cycles. The deposited film of FIG. 4E exhibits a relatively planar surface compared to the topography of the initial trenches.

In some embodiments, planarity of the film can be tailored based on the length of the time period over which excess of reactant vapor is removed from contact with the substrate. Decreasing the period of time over which excess reactant is removed increases the planarity of the deposited organic film. In some embodiments, each of removing the excess of the first reactant vapor and removing the excess of the second reactant vapor occurs over a time period greater than 1 second, less than 10 seconds, between about 1 second and about 10 seconds, and/or between any of the other foregoing values.

Example 1

Figure 5A:
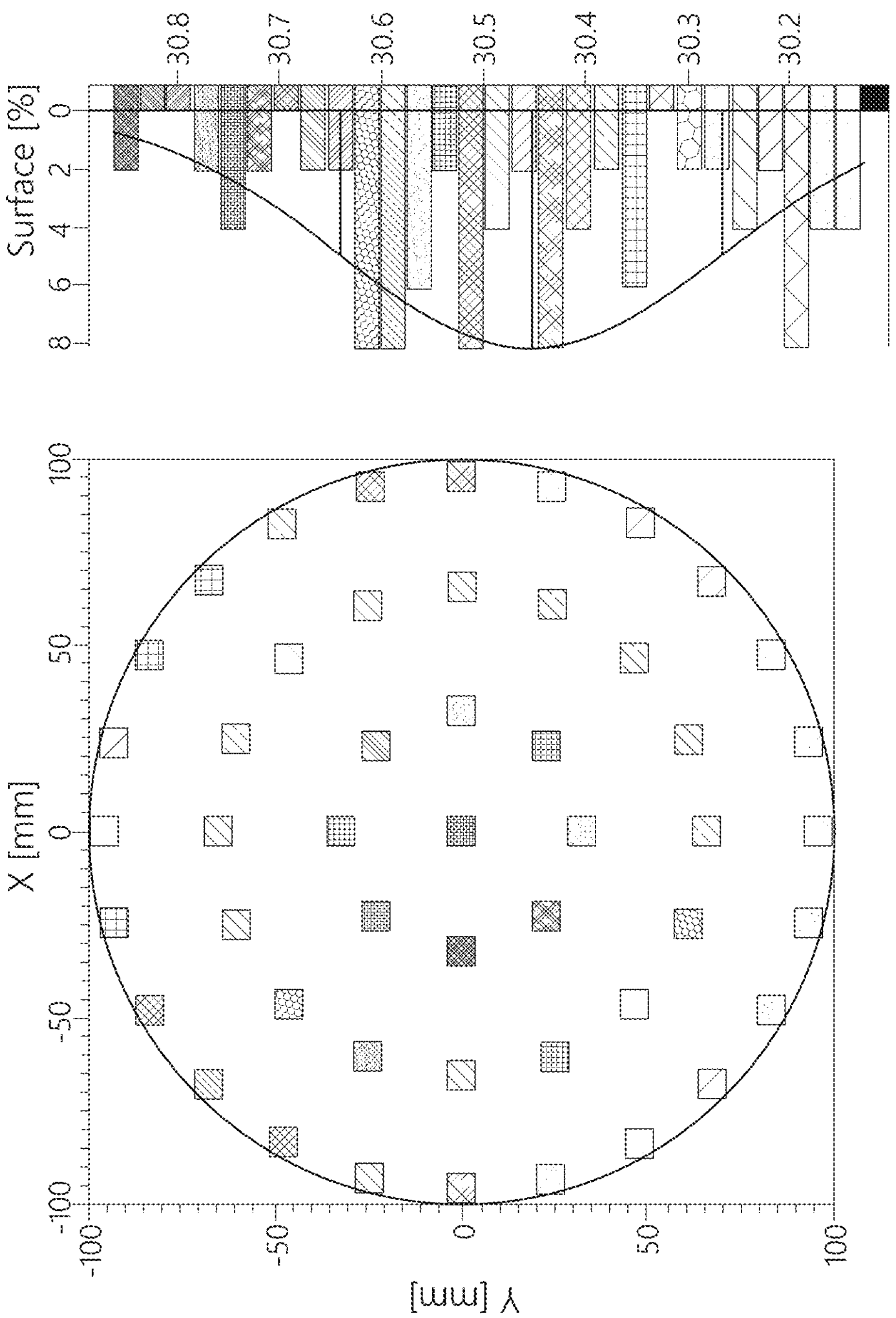
FIGS. 5A-D are thickness maps of films deposited by methods in which the deposition temperature is higher than the vaporization vessel and by a deposition process employing higher vaporization temperatures than deposition temperatures, respectively.
Figure 5B:
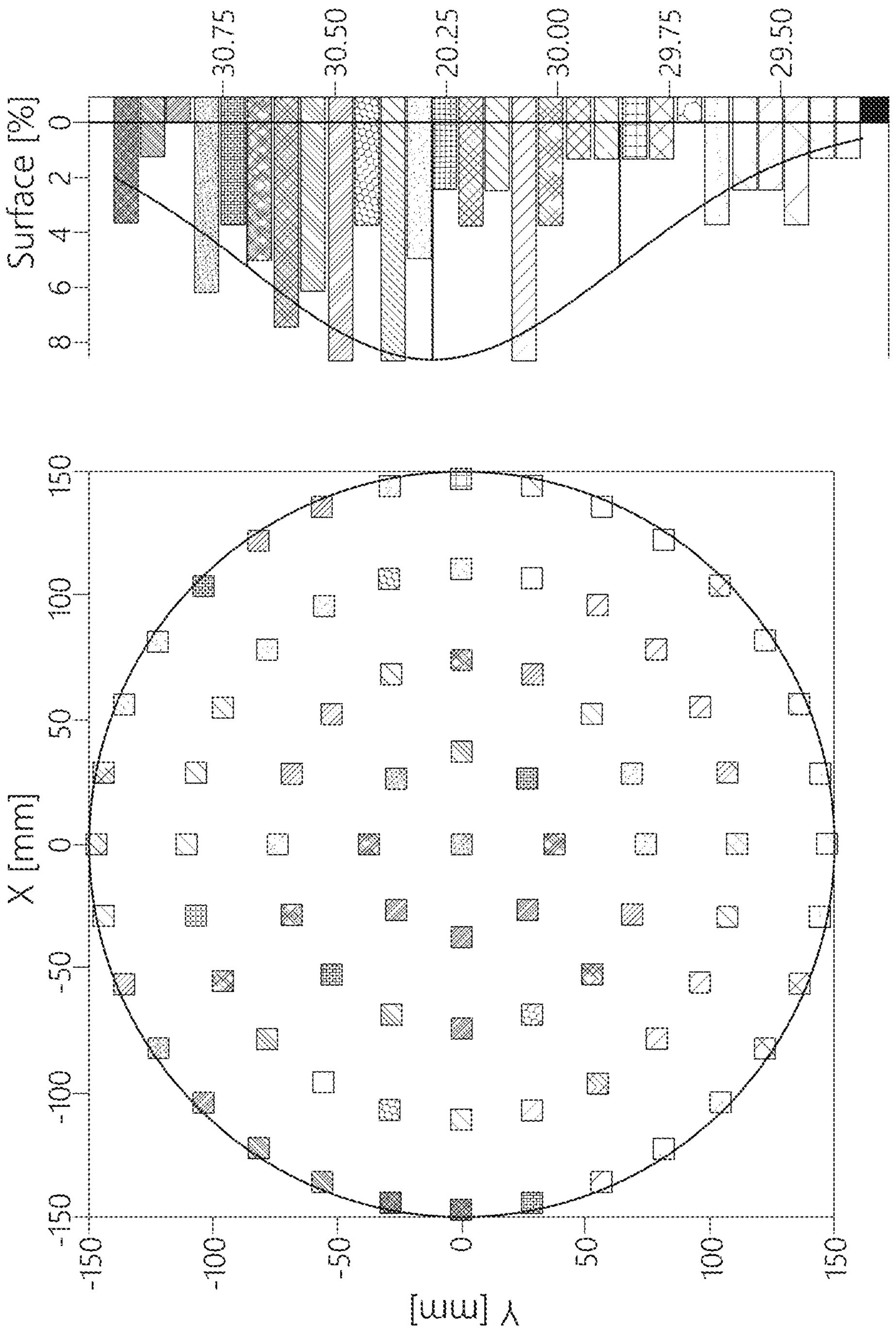
Figure 5C:
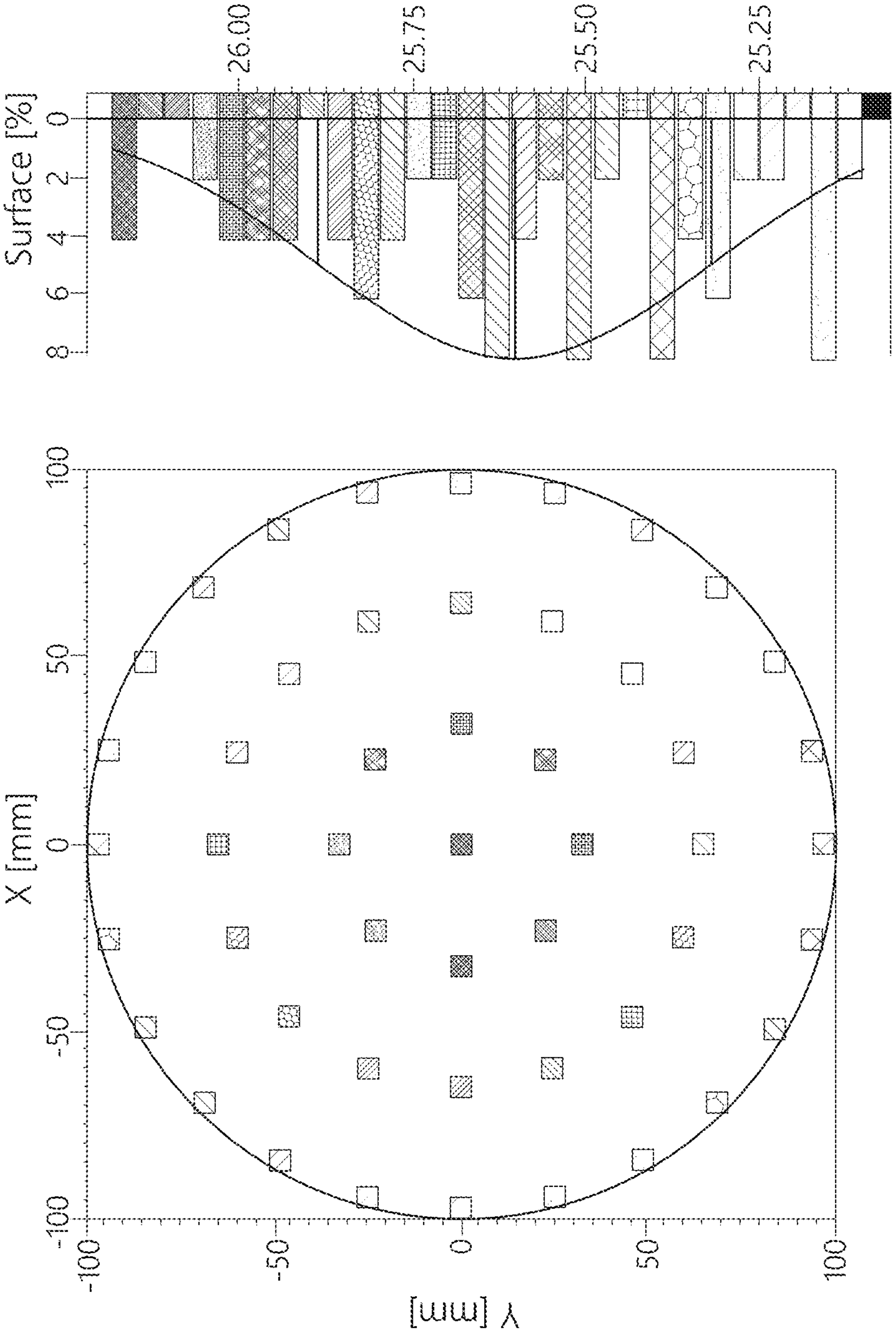
Figure 5D:
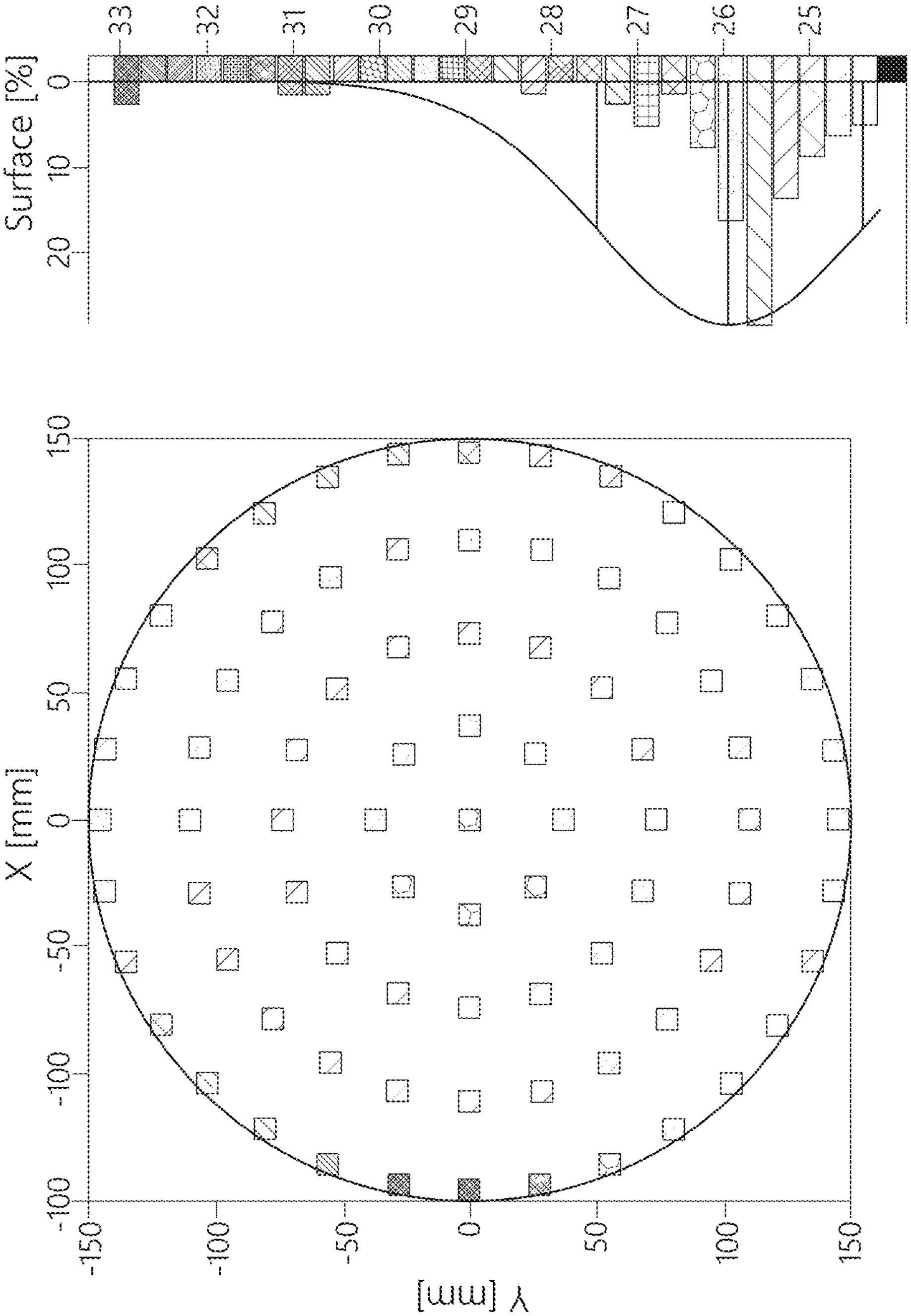

FIGS. 5A-5D show the results of experiments comparing similar sequential deposition processes using a negative temperature difference from the vaporizer to the substrate (FIGS. 5A & 5B) and using a positive temperature difference from the vaporizer to the substrate (FIGS. 5C & 5D). All experiments employed 300 mm wafers in a PULSAR 3000™ beta ALD tool supplied by ASM International, N.V. (Almere, The Netherlands). The negative temperature difference deposited a film at more than three times the growth rate, and produced a film with much higher thickness uniformity, compared to a process with a positive difference.

For the negative temperature difference experiment, PMDA and DAH were alternately and sequentially provided to the substrate in a sequential deposition process to deposit a polyimide film. The first reactant PMDA was vaporized at a temperature of 150° C., the PMDA gas line was maintained at 153° C., and the substrate was maintained at 127° C. The second reactant DAH was kept at 45° C. Line flows of 450 sccm were used, and pulse/purge lengths of 11/8.066 seconds and 4.68/9 seconds were used for PMDA and DAH, respectively. The pulsing pressure difference was set to about 45 Torr for PMDA, and no line filters were used. 60 deposition cycles were applied, and the resulting film was analyzed by spectroscopic ellipsometry. FIGS. 5A & 5B show the thickness maps obtained on a 200 mm wafer mapping size and a 300 mm wafer mapping size, respectively, in both cases employing 3 mm edge exclusions. The growth rate was 5.1 Å per cycle and 1σ thickness non-uniformities were 0.6% and 1.4% using the 200 mm and 300 mm mapping sizes, respectively.

For the positive temperature difference experiment, the first reactant PMDA was vaporized at a temperature of 140° C., the PMDA gas line was maintained at 143° C., and the substrate was maintained at 150° C. The second reactant DAH was kept at 45° C. Line flows of 450 sccm were used, and pulse/purge lengths of 5/5 seconds and 2/5 seconds were used for PMDA and DAH, respectively. The pulsing pressure difference was set to about 45 Torr for PMDA, and no line filters were used. 165 deposition cycles were applied, and the resulting film was analyzed by spectroscopic ellipsometry. FIGS. 5C & 5D show the thickness maps obtained using either 200 mm wafer mapping size and 300 mm wafer mapping size, in both cases applying 3 mm edge exclusions. The growth rate was 1.6 Å per cycle and 1 σ thickness non-uniformities were 1.1% and 6.0% using the 200 mm and 300 mm mapping sizes, respectively.

Example 2

In another negative temperature difference experiment conducted on wafers patterned with trenches, PMDA and DAH were reacted in a sequential process to deposit a polyimide film on a substrate with trench patterns. The trenches had variable pitches of 40 and 50 nm with 25-35 nm openings. The first reactant PMDA was vaporized at a temperature of 150° C., the PMDA gas line was maintained at 153° C., and the substrate was maintained at 127° C. The second reactant DAH was kept at 45° C. Line flows of 450 sccm were used, and pulse/purge lengths of 11/8.066 seconds and 4.68/9 seconds were used for PMDA and DAH, respectively. The resulting film was analyzed by tunneling electron microscopy (TEM). After 20 cycles, the TEM image showed that the film was thicker on the trench bottom areas, and thinner on the side walls of the trenches. The film thickness on a planar wafer grown using the same parameters was 7 nm, the film thickness on the bottom of some trenches was about 11 nm, and the film thickness on the sides of some trenches was about 4 nm. The growth was thus proceeding faster in the bottom areas of the trenches, indicating bottom-up filling. After 60 deposition cycles, the TEM analysis showed seamless, bottom-up gap filling of the trenches with polyimide. The top surface was relatively smooth, exhibiting some self-planarizing behavior.

Example 3

In another negative temperature difference experiment, PMDA and DAH were reacted in sequential deposition processes to deposit a polyimide films on substrates with trench patterns. Different time purge lengths were used. In one film, a purge length of 8.066 seconds was used for PMDA and 9.0 seconds for DAH, in another film a purge length of 15 seconds was used for each of PMDA and DAH, and in another film a purge length of 25 seconds was used for each of PMDA and DAH. The resulting films were analyzed by TEM. Purge length did seem to affect gap filling performance. However, shorter purges resulted in more planar film on top of the structures. Purge length can thus be used as a factor to tailor the final morphology of the film.

Example 4

In another negative difference experiment, PMDA and DAH were reacted in two separate alternative and sequential deposition processes at different temperatures. In the first experiment, the PMDA was vaporized at 150° C., and the substrate was maintained at 127° C. In the second experiment, the PMDA was vaporized at 180° C., and the substrate was maintained at 160° C. The film deposited in the first experiment was predominantly polyamic acid, and the film deposited in the second experiment was predominantly polyimide. Deposition temperature appears to affect the composition of the deposited film when the reactants are PMDA and DAH. A lower deposition temperature appears to lead to greater proportion of polyamic acid, and a higher deposition temperature appears to lead to greater proportion of polyimide.

Example 5

In another negative temperature difference experiment, deposited polyamic film was annealed to form polyimide. When reacting PMDA and DAH, polyamic acid is deposited in greater proportions at lower deposition temperatures. Conversion to polyimide was confirmed by FTIR spectroscopy. Data for the four polyamic films annealed at different temperature is as follows:

TABLE I

| | Polyamic Film Deposited at 127° C. | | | | Annealed Film | | |
|---|---|---|---|---|---|---|---|
| Film | Ave. Thickness (nm) | Thickness Non-uniformity (1σ) | Refractive Index | Anneal Temp. (° C.) | Ave. Thickness (nm) | Thickness Non-uniformity (1σ) | Refractive Index |
| 1 | 32.898 | 1.44 | 1.578 | 200 | 22.707 | 1.99 | 1.6099 |
| 2 | 31.048 | 1.87 | 1.5719 | 250 | 20.438 | 2.89 | 1.6119 |
| 3 | 31.183 | 1.65 | 1.572 | 300 | 20.385 | 2.11 | 1.6149 |
| 4 | 30.665 | 1.81 | 1.5642 | 350 | 19.426 | 2.39 | 1.6056 |

Example 6

In another negative temperature difference experiment, organic films were deposited at different temperatures. Thickness was analyzed thickness was measured with spectroscopic electrometry (SE) and X-ray reflectivity (XRR). Density and RMS-roughness were also measured. Data for the four films is as follows:

TABLE II

| Film | Deposition Temperature | Anneal | SE Thickness (nm) | XRR Thickness (nm) | Density ($g/cm^3$) | Roughness (nm) |
|---|---|---|---|---|---|---|
| 1 | 127° C. | No | 32.6 | 33.4 | 1.419 | 0.338 |
| 2 | 127° C. | 200° C. | 24.6 | 24.6 | 1.434 | 0.449 |
| 3 | 150° C. | No | 25.2 | 25.9 | 1.472 | 0.377 |
| 4 | 160° C. | No | 38.2 | 39.4 | 1.401 | 0.400 |

Example 7

In another negative temperature difference experiment, water was used to etch the deposited films to confirm conversion from polyamic acid to a more etch resistant polymer, such as polyimide. Polyamic acid is water soluble and can be etched by water. Polyimide, by contrast, is not water soluble and cannot be etched by water. The first film was deposited at 127° C. and thus was predominantly polyamic acid. The second film was deposited at 160° C. and thus was predominantly polyimide. The third film was deposited at 127° C. and subsequently treated with argon plasma to convert the deposited polyamic acid to polyimide. Thickness of the films was measured before and after exposure to water and compared to determine the extent of etching by the water. The following data shows that the polyamic film deposited at 127° C. was etched by the water, and the polyimide film deposited at 160° C. and the polyamic acid film deposited at 127° C. and subsequently cured to form polyimide were not etched by the water:

TABLE III

| Deposition at 127° C. | | | |
|---|---|---|---|
| Time (s) in $H_2O$ | Start Thickness (nm) | End Thickness (nm) | Δ (nm) |
| 1 | 33.20 | 7.10 | 26.10 |
| 5 | 33.12 | 9.27 | 23.85 |
| 10 | 33.07 | 7.52 | 25.55 |

TABLE IV

| Deposition at 160° C. | | | |
|---|---|---|---|
| Time (s) in $H_2O$ | Start Thickness (nm) | End Thickness (nm) | Δ (nm) |
| 10 | 41.10 | 40.87 | 0.23 |
| 20 | 40.72 | 39.89 | 0.83 |
| 60 | 40.18 | 40.63 | −0.45 |

TABLE V

| Deposition at 127° C., followed by treatment with argon plasma (200 W, 2 min) | | | |
|---|---|---|---|
| Time (s) in $H_2O$ | Start Thickness (nm) | End Thickness (nm) | Δ (nm) |
| 10 | 40.05 | 41.33 | −1.28 |
| 120 | 39.96 | 40.85 | −0.89 |
| 300 | 39.40 | 41.02 | −1.62 |

Example 8

Figure 6A:
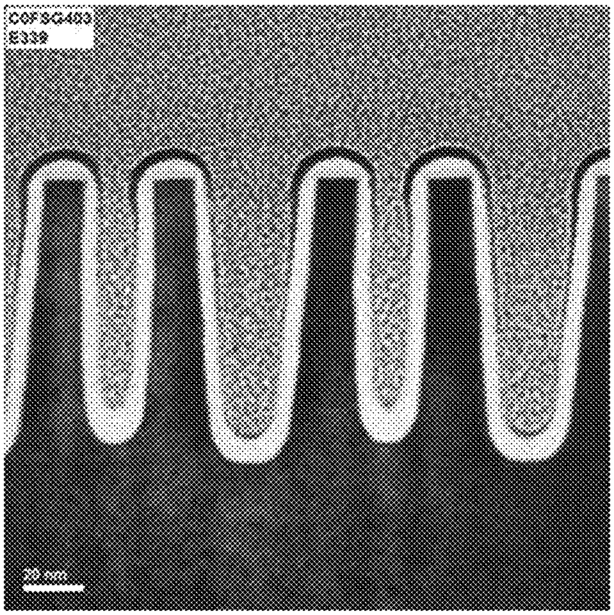
FIGS. 6A-6B are representations of bottom-up filling of trenches in accordance with a method for vapor depositing an organic film.
Figure 6B:
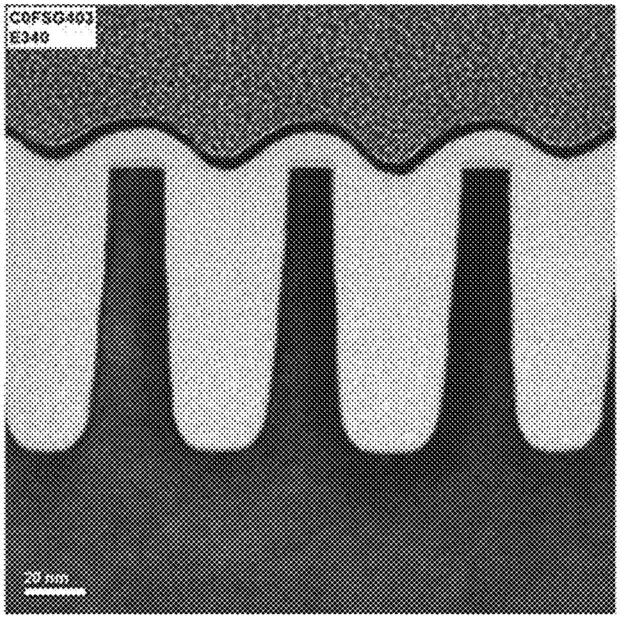

In another negative temperature difference experiment conducted on wafers patterned with trenches, 1,4-phenylenediisocyanate (PDIC) and DAH were reacted in a sequential process to deposit a polyurea film on a substrate with trench patterns. The trenches had variable pitches of 40 and 50 nm with 25-35 nm openings. The first reactant PDIC was vaporized at a temperature of 75° C., the PDIC gas line was maintained at 85° C., and the substrate was maintained at 40° C. The second reactant DAH was kept at 45° C. Line flows of 450 sccm were used, and pulse/purge lengths of 3/2 seconds and 8/7 seconds were used for PDIC and DAH, respectively. The resulting film was analyzed by tunneling electron microscopy (TEM). After 50 cycles, the TEM image showed that the film was thicker on the trench bottom areas, and thinner on the side walls of the trenches (FIG. 6A). The film thickness on a planar wafer grown using the same parameters was 7 nm, the film thickness on the bottom of some trenches was about 10 nm, and the film thickness on the sides of some trenches was about 3 nm. The growth was thus proceeding faster in the bottom areas of the trenches, indicating bottom-up filling. After 215 deposition cycles, the TEM analysis (FIG. 6B) showed seamless, bottom-up gap filling of the trenches with polyurea. The aspect ratio of the three-dimensional features was decreased, exhibiting some self-planarizing behavior.

Figure 7:
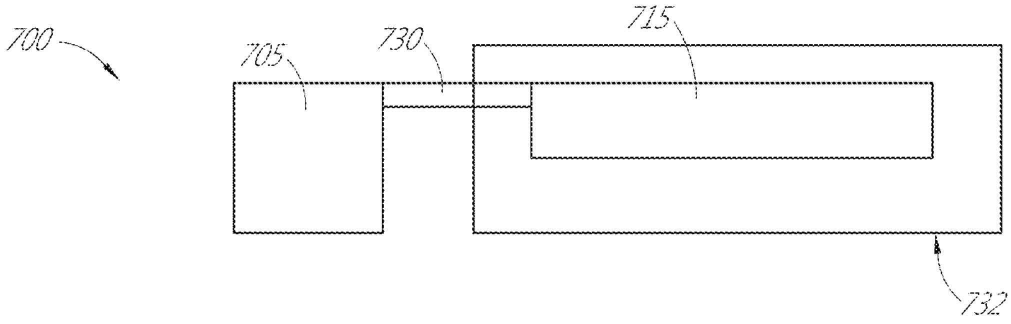
FIG. 7 is a schematic side section of a vapor deposition apparatus in accordance with certain embodiments described herein.
Figure 8:
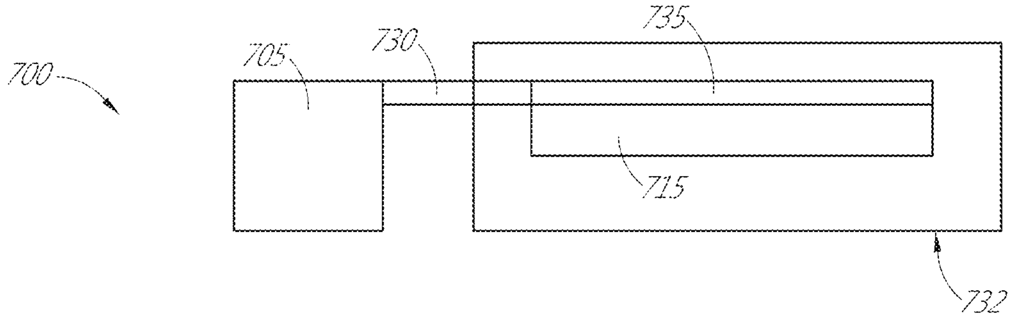
FIG. 8 is a schematic side section of a vapor deposition apparatus with a heated vapor distribution block, in accordance with certain embodiments.
Figure 9:
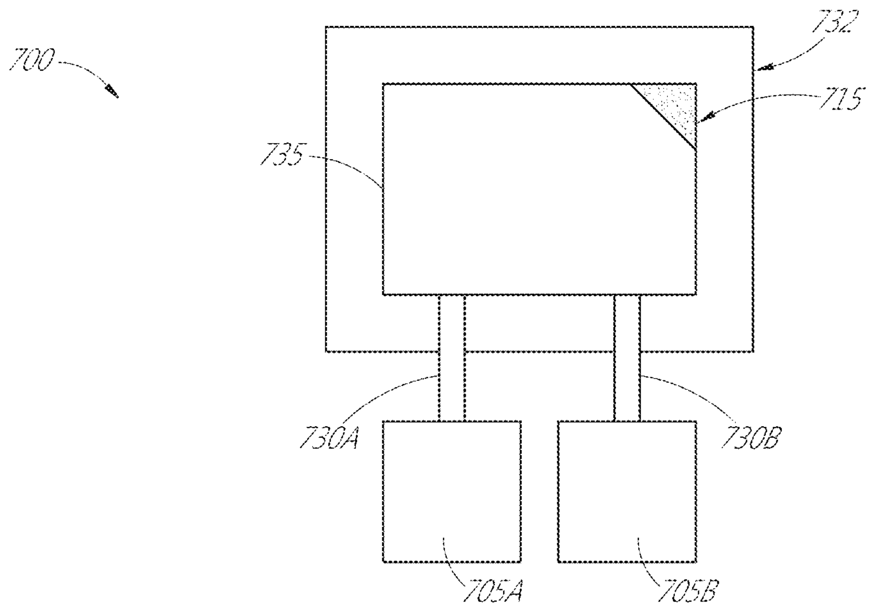
FIG. 9 is a schematic top plan view of a vapor deposition apparatus with two heated vapor sources and two vapor feeds to a heated vapor distribution block in accordance with certain embodiments

FIGS. 7-9 are high level schematic views of vapor deposition apparatuses configured for providing reactant vapor feedthroughs from the side of the reaction space, despite an overhead gas distribution system. The use of a side feedthrough results in a shorter path from the organic precursor vaporizer to the gas distribution block compared to convention overhead, symmetrical feeding to, e.g., a showerhead plenum. The shorter reactant path can be advantageous for operation and maintenance of the apparatus for vapor deposition of organic films, as described above. Other features of the vapor deposition apparatus, such as second reactant sources, reactant inlets, inlet manifolds, exhaust outlets and control systems, are not shown for simplicity, but can be as described with respect to FIG. 2A, for example.

FIG. 7 is a schematic side section of a vapor deposition apparatus 700 in accordance with certain embodiments described herein. A first reactant vessel 705 can be a heated reactant source, such as a vaporizer for an organic reactant suited for ALD of organic films as described above. An inner reaction chamber defines a reaction space 115 in which one or more substrates can be supported. A gas line 730 leading from the first reactant vessel 705 to the reaction space 715 is also heated. A separate outer vacuum chamber 732 surrounds the inner reaction chamber. The temperature profile can follow that of FIG. 3B, such that the gas line 730 is at a higher temperature than either the reactant vessel 705 or the substrate temperature in the reaction space 715; and the reactant vessel 705 is at a higher temperature than the substrate temperature in the reaction space 715.

FIG. 8 shows the vapor deposition apparatus 700, where similar parts to those of FIG. 7 are referenced by like reference numbers. In FIG. 8, the inner reaction chamber is shown as including two parts: a heated block 735 and the reaction space 715. The heated block 735 can have a higher temperature than the heated gas line 730, such that the temperature can increase from reactant vessel 705 to the gas line 730 to the heated block 735, with the substrate in the reaction space 715 being at a lower temperature than the reactant vessel 705. The heated block 735 can serve to distribute the reactant vapors evenly across the substrate housed in the reaction space 715. For example, the heated block 735 can represent a showerhead over a substrate support (e.g., susceptor) in the reaction space 715.

In FIGS. 7 and 8, the heated reactant vessel 705 and the heated gas line 730 that feeds into the reaction chamber are both located on the side of the chamber. This arrangement facilitates reactor servicing and the chamber can be easily opened from the top. In contrast, typical showerhead reactors feed reactants through the top of the chamber symmetrically relative to the distribution perforations. Such an overhead feed lengthens the path for the reactants and also makes opening the chamber for servicing more difficult, particularly for organic film deposition. Also the heating of the gas line 730, particularly the portion feeding through the reaction chamber, is easier when it is on the side, and the length of the feedthrough portion of the heated gas line 730 can be made very small. Such an arrangement makes it more efficient and easier to eliminate cold spots from the line. Better conductance can also be achieved with a shorter feedthrough line hence allowing larger precursor doses.

While FIGS. 7 and 8 only show one heated reactant vessel and heated gas line for purposes of illustration, the skilled artisan will appreciate that the number of heated sources and heated lines can be more than one, depending on the number and type of precursors in the organic film deposition recipe.

FIG. 9, for example, is a schematic top plan view of the vapor deposition apparatus 700 with two heated reactant vessels 705A and 705B, and two heated gas lines 730A and 730B feeding through the outer vacuum chamber 732 to the heated block 735 in accordance with certain embodiments. The heated block 735 can be a gas distribution block (e.g., showerhead) over the reaction space 715, which can include a substrate support. The substrate support can comprise a round susceptor plate attached to an elevator for easy wafer transfer within the outer vacuum chamber 732.

The heated block 735 can distribute precursor gases from the reactant source vessels 705A and 705B evenly across the substrate(s) housed within the reaction space 715. The heated block 735 can have a multitude of designs. In one embodiment all the inlet gas feedthroughs are led to the same space (e.g., common showerhead plenum) and the precursors flow from the same channels (e.g., showerhead perforations to the substrate in the reaction space 715). In another embodiment, different precursor gases are led through different channels to the substrate so that the reaction space 715 is the first location where the different reactants meet. Such an arrangement is preferred for certain ALD recipes to avoid reactions between mutually reactive elements from occurring inside the heated block 735, and thus avoiding particle formation. In one example, a dual reactant showerhead, which provide separate plenums and separate perforations for separate reactants, can be employed. In another example, separate perforated pipes can be provided for separate reactants. Whether the reactants should remain separated or go through a common distribution plenum upon depends on the actual reactants and reaction temperatures for the deposition recipe.

Figure 10:
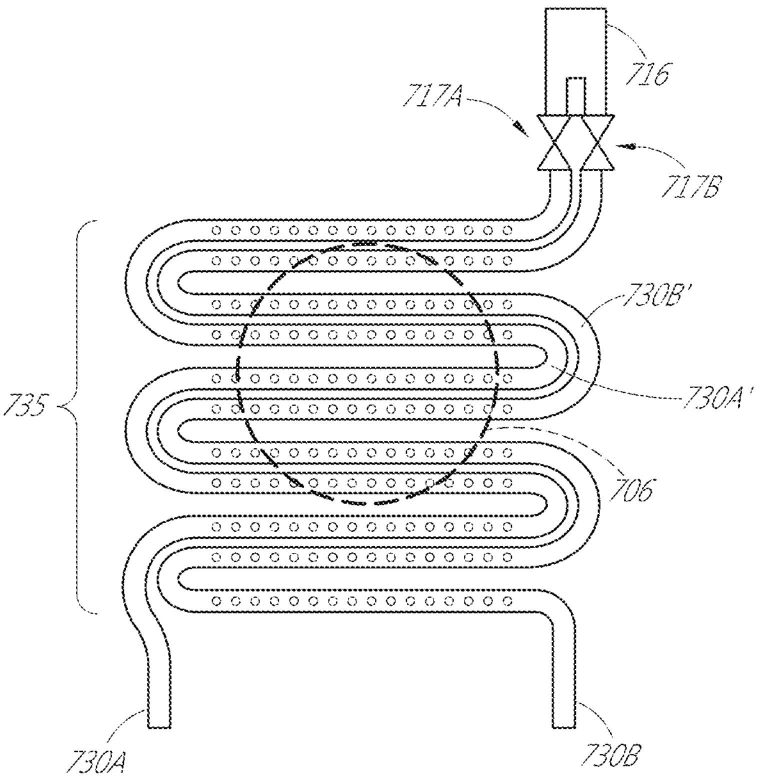
FIG. 10 is a schematic top plan view of an example of a gas distribution block with separate distribution of separate reactants for use in conjunction with the embodiments of FIG. 8 or 9.

FIG. 10 is a schematic top plan view of an example of a gas distribution block 735 with separate distribution of separate reactants for use in conjunction with the embodiments of FIG. 8 or 9. It will be understood that the dimensions are not to scale in the schematic representation. In FIG. 10, the heated gas lines 730A and 730B extend into heated reactant distribution tubes 730A' and 730B' with perforations above the substrate 706, which is supported in the reaction space below the tubes. The distribution tubes 730A' and 730B' lead to an exhaust 716 by way of separately controllable valves 717A and 717B. The valves 717A and 717B can control precursor flow and purging from the heated distribution tubes 730A' and 730B' between reactant phases.

Figure 11:
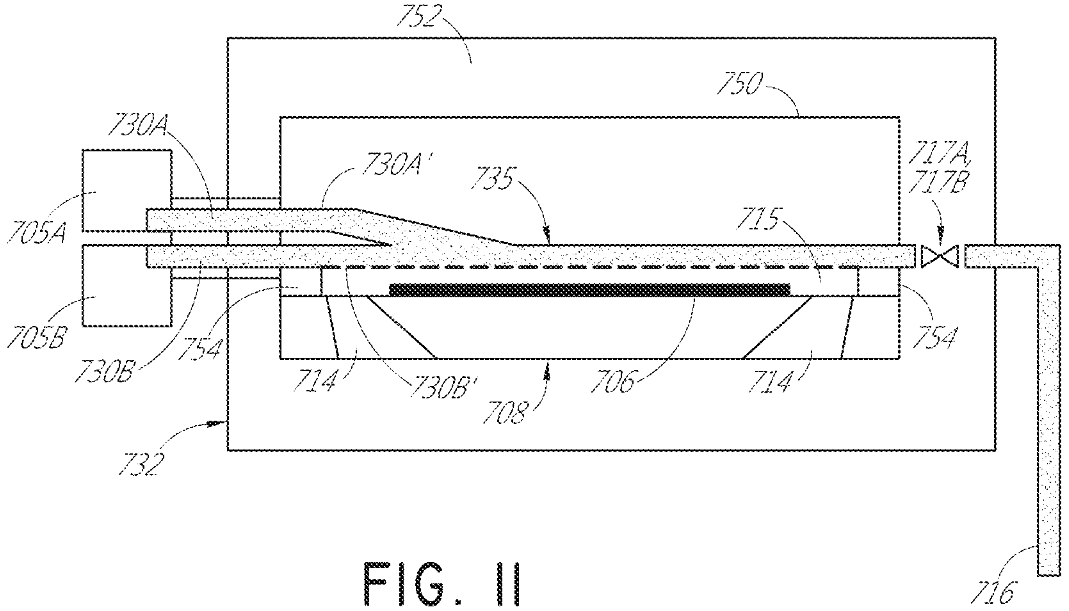
FIG. 11 is a schematic side section of a vapor deposition apparatus incorporating the gas distribution block of FIG. 10.

FIG. 11 is a schematic side section of a vapor deposition apparatus incorporating the gas distribution block 735 of FIG. 10. The heated reactant vessels 705A and 705B feed the heated gas lines 730A and 730B, which in turn extend into heated gas distribution tubes 730A' and 730B'. Valves 717A, 717B control flow from the gas distribution tubes 730A' and 730B' to exhaust 716 in order to control reactant flow and purging in operation. The distribution tubes 730A' and 730B' extend into a cover block 750 for the inner reaction chamber. The outer vacuum chamber 732 and the inner reaction chamber define a vacuum space 752 between them. A substrate 706 is shown supported on a substrate support 708, and an exhaust 714 is provided around the location at which the substrate 706 is supported. The exhaust 716 for the gas distribution tubes 730A' and 730B' and the exhaust 714 for the reaction space 715 can connect to the same or different vacuum sources. A spacer 754 between the cover block 750 and the substrate support 708 aids in sealing the reaction space 715.

FIGS. 10 and 11 show one possible design for the inner part of the heated gas distribution block 735. Two labyrinthine tubes 730A' and 730B' are shown zig-zagging over the substrate 706. The first reactant is spread across the substrate 706 from the holes in the first distribution tube 730A' and a second reactant is distributed from the holes of the second distribution tube 730'B. Both tubes 730A' and 730B' lead to pump exhaust 716. During supply of first reactant to the substrate, inert carrier gas can be used to facilitate reactant flow to the first distribution tube 730A'. The pressure in the reaction space 715 can be kept lower than in the distribution tube 730A' and thus precursor flows from the tube 730A' to the surface of the substrate 706. In an ALD sequence, during purge between reactant pulses, reactant flow is stopped and only carrier gas flows in the first tube 730A'. The tube 730A' can be purged efficiently because it also leads to the exhaust 716. The valves 717A and 717B can be closed during reactant provision to encourage the reactant flow to the reaction space 715 and opened again during purge. This type of showerhead-like gas distribution system has the benefits of a showerhead but it can be purged more effectively to reduce particle formation. The hole sizes in the tubes can be optimized with routine experimentation. The tubes 730A' and 730B' extend within the cover block 750 to minimize reactant escape to the outer vacuum chamber 732, leading to greater efficiency of precursor consumption.

As described above, the temperature gradient can increase from the reactant vessels 705A and 705B to their respective gas lines 730A and 730B, and continue to increase to the tubes 730A' and 730B' of the distribution block 735. The substrate support 708 and the substrate 706 supported on it can be at a lower temperature than the reactant vessels 705A and 705B, and thus also at a lower temperature than the heated gas lines 730A and 730B and the distribution block 735. In other words, the system controls can control a vaporization temperature A, a substrate temperature B, a gas line temperature C and a gas distribution block temperature D, such that $B<A<C<D$.

In the deposition apparatus 700 of FIG. 11, the reaction space 715 has its own exhaust 714. In the illustrated embodiment, the exhaust 714 surrounds the substrate (e.g., wafer) evenly and gases are pumped from all around the substrate.

FIGS. 10 and 11 show one example for the gas distribution block. In other embodiments, the tubes 730A' and 730B' can be made in different shapes, such as spirals. Preferably the flow paths have no sharp turns or corners so that gas flows fluidly and with minimal turbulence.

Figure 12:
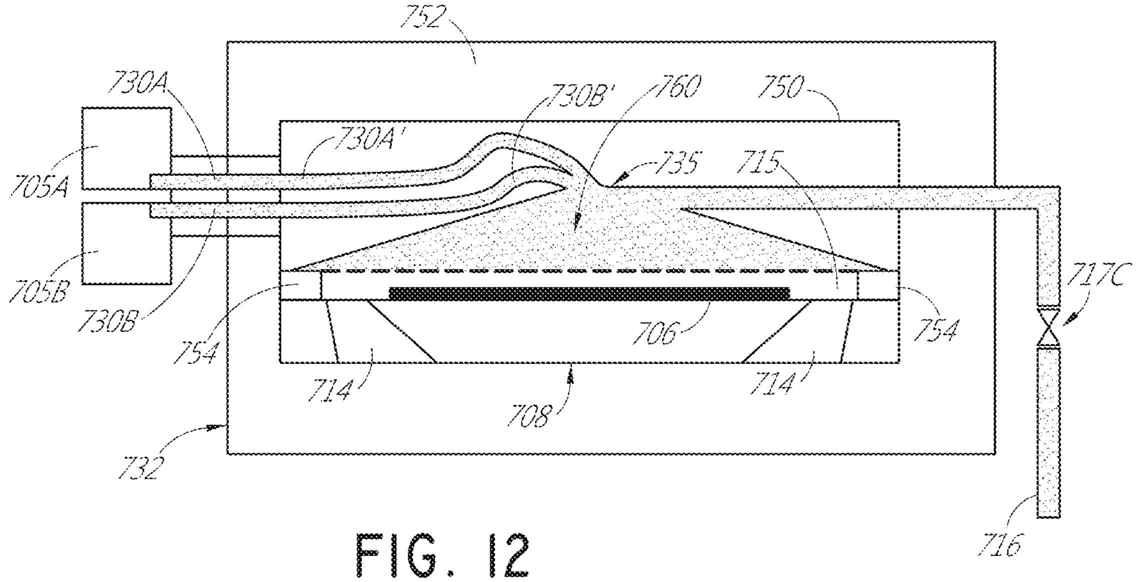
FIG. 12 is a schematic side section of a vapor deposition apparatus with common distribution paths for separate reactants.

FIG. 12 is a schematic side section of a vapor deposition apparatus with common distribution paths for separate reactants, where similar parts to those of FIG. 11 are referenced by like reference numbers. The embodiment of FIG. 12 differs from FIG. 11 in that a traditional showerhead 760 serves as the heated distribution block 735, in place of the tubes of FIG. 11. The temperatures can increase from the first reactant vessel 705A to the corresponding heated gas line 730A to the corresponding feedthrough line 730A' to the showerhead 760. Similarly, the temperatures can increase from the second reactant vessel 705B to the corresponding heated gas line 730B to the corresponding feedthrough line 730B' to the showerhead 760. The substrate 706 in the reaction space 715 beneath the showerhead 760 can be at a lower temperature than the reactant vessels 705A and 705B and intervening features along the flow paths. In other words, the system controls can control, for each reactant, a vaporization temperature A, a substrate temperature B, a gas line temperature C, a gas feedthrough temperature D and a gas distribution block temperature E, such that $B<A<C<D<E$. Similar to the valve 717A, 717B of FIG. 11, a valve 717C can control reactant flow and purging of the showerhead 760 between reactant pulses.

In other embodiments, the distribution block can be similar to the gas distribution systems of US Patent Publication Nos. US2004216665, US20030075273 and US2004216668, the entire disclosures of which are incorporated herein by reference for all purposes. In such embodiments, as well as the embodiments of FIGS. 7-12, gases can be distributed from overhead for more even distribution of reactants across the substrate compared to horizontal or cross-flow reaction chambers.

Unlike traditional showerhead or dual showerhead gas distribution systems, however, the side feedthroughs present shorter and less complex flow paths to the distribution block. Traditional showerhead systems are not generally good for low vapor pressure precursors such as the organic precursors for organic film deposition as described herein. They tend to have long precursor pipes connected to the top of the showerhead with lots joints and valves tend to decrease efficient temperature control, and can cause particle generation due to cold spots. The illustrated side feedthroughs are more easily heated uniformly with suitably positioned heaters and temperature sensors, in addition to facilitating access for maintenance and cleaning between deposition runs.

Moreover, the deposition apparatus can be provided with in situ cleaning systems. Unlike inorganic films, organic films and precursor residue that may be formed along the gas distribution paths of the deposition reactors described herein can be relatively easily cleaned by oxidation reactions. Accordingly, in situ cleaning can be accomplished by providing of oxygen-containing vapor to the gas lines or directly by separate supply to the gas distribution block 735. For example, $O_2$ can be provided to the gas distribution block 735 or upstream to the heated gas lines or heated gas feedthroughs. More preferably activated oxidants, such as $O_3$ gas or O plasma products, are supplied for in situ cleaning cycles periodically between depositions or deposition runs.

Although certain embodiments and examples have been discussed, it will be understood by those skilled in the art that the scope of the claims extend beyond the specifically disclosed embodiments to other alternative embodiments and/or uses and obvious modifications and equivalents thereof.

What is claimed is:

1. A method for vapor depositing an organic film, comprising:

vaporizing a first organic reactant in a vaporizer at a temperature A to form a first reactant vapor;

exposing a substrate in a reaction space to the first reactant vapor, wherein the substrate comprises a non-planar topography having three-dimensional structures including a plurality of trenches extending inwardly from a surface of the substrate, wherein the substrate is at a temperature B, the temperature B being lower than the temperature A; and depositing the organic film on the substrate, wherein the depositing includes depositing a first thickness on a lower feature of the substrate within the plurality of trenches and depositing a second thickness on an upper field region of the substrate outside the plurality of trenches, wherein the first thickness is greater than the second thickness.

2. The method of claim 1, wherein the organic film comprises a polymer.

3. The method of claim 2, wherein the polymer comprises a polyurea.

4. The method of claim 1, wherein the first organic reactant comprises 1.4-phenylenediisocyanate.

5. The method of claim 1, wherein a ratio of the temperature A to the temperature B in Kelvin is between about 1 and about 1.15, and/or wherein the temperature B is between about 5° C. and about 50° C. lower than the temperature A.

6. The method of claim 1, wherein the plurality of trenches have a lateral dimension within a range of 5 nm to 10 μm, and wherein the depositing decreases an aspect ratio of the plurality of trenches by a factor of more than 1.5.

7. The method of claim 1, wherein exposing the substrate comprises self-limitingly adsorbing a species of the first organic reactant on the substrate, the method further comprising:

removing excess of the first reactant vapor from contact with the substrate;

exposing the substrate to a second reactant, such that the first reactant vapor and the second reactant do not substantially mix; and removing excess of the second reactant from contact with the substrate.

8. The method of claim 7, wherein the first reactant vapor comprises 1,4-phenylenediisocyanate and the second reactant comprises 1,6-diaminohexane, and wherein the organic film deposited on the substrate is a polyurea film.

9. The method of claim 7, wherein removing the excess of the first reactant vapor occurs over a time period of between about 1 second and about 10 seconds, and wherein removing the excess of the second reactant occurs over a time period of between about 1 second and about 10 seconds.

10. The method of claim 7, further comprising repeating exposing the substrate to the first reactant vapor and exposing the substrate to the second reactant in a plurality of cycles such that the first reactant vapor and the second reactant do not substantially mix.

11. The method of claim 1, wherein the plurality of trenches have a lateral dimension within a range of 5 nm to 10 μm and an aspect ratio within a range of 0.25 to 1000, and wherein the depositing includes bottom-up filling the plurality of trenches so as to decrease the aspect ratio by a factor of more than 1.5.

12. The method of claim 1, wherein the plurality of trenches have a lateral dimension within a range of 5 nm to 500 nm and an aspect ratio within a range of 0.5 to 100, and wherein the depositing includes bottom-up filling the plurality of trenches so as to decrease the aspect ratio by a factor of more than 1.5.

13. The method of claim 12, wherein a ratio of the temperature A to the temperature B in Kelvin is between about 1 and about 1.15, and wherein the temperature B is between about 5° C. and about 50° C. lower than the temperature A.

14. The method of claim 12, wherein the depositing further comprises:

exposing the substrate to a second reactant vapor to react with a species of the first reactant vapor on the substrate; and alternately and sequentially repeating exposing the substrate to the first reactant vapor and exposing the substrate to the second reactant vapor.

15. The method of claim 14, wherein the second reactant vapor comprises 1,6-diaminohexane.

16. The method of claim 14, wherein the first reactant vapor comprises 1,4-phenylenediisocyanate and the second reactant vapor comprises 1,6-diaminohexane, and wherein the organic film deposited on the substrate is a polyurea film.

17. The method of claim 1, wherein exposing the substrate to the first reactant vapor comprises transporting the first reactant vapor through a gas line from the vaporizer to the reaction space, wherein the gas line is at a temperature C, the temperature C being higher than the temperature A.

18. The method of claim 1, further comprising removing excess of the first reactant vapor from contact with the substrate over a period of time, wherein decreasing the period of time increases a planarity of the deposited organic film.

19. The method of claim 18, further comprising:

exposing the substrate to a second reactant such that the first reactant vapor and the second reactant do not substantially mix;

removing excess of the second reactant from contact with the substrate; and repeating exposing the substrate to the first reactant vapor and exposing the substrate to the second reactant in a plurality of cycles such that the first reactant vapor and the second reactant do not substantially mix.

* * * * *